USO09425731B2

(12) United States Patent
Durney et al.

(10) Patent No.: US 9,425,731 B2
(45) Date of Patent: *Aug. 23, 2016

(54) SOLAR PANEL RACK

(71) Applicant: INDUSTRIAL ORIGAMI, INC., Middleburg Heights, OH (US)

(72) Inventors: Max W. Durney, SanFrancisco, CA (US); Keith A. Bell, Cleveland, OH (US)

(73) Assignee: Industrial Origami, Inc., Middleburg Heights, OH (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/866,218

(22) Filed: Sep. 25, 2015

(65) Prior Publication Data

US 2016/0013750 A1   Jan. 14, 2016

Related U.S. Application Data

(63) Continuation of application No. 14/563,600, filed on Dec. 8, 2014, now Pat. No. 9,166,521, which is a continuation of application No. 13/543,569, filed on Jul. 6, 2012, now Pat. No. 8,936,164.

(51) Int. Cl.
*H01L 31/042* (2014.01)
*F16B 5/12* (2006.01)
(Continued)

(52) U.S. Cl.
CPC .............. *H02S 20/00* (2013.01); *F16B 5/125* (2013.01); *F16M 11/04* (2013.01); *F24J 2/526* (2013.01);
(Continued)

(58) Field of Classification Search
CPC .. H02S 20/00; F24J 2/526; F24J 2002/4674; F24J 2002/5215
USPC ......... 211/41.1, 26, 26.2; 136/251; 248/237; 52/173.3; 126/569, 623; 29/890.033
See application file for complete search history.

(56) References Cited

U.S. PATENT DOCUMENTS 387,651 A   8/1888   Maxim
624,144 A   5/1899   Wilmot
(Continued)

FOREIGN PATENT DOCUMENTS

CN    1915550         2/2007
DE    10054349 A1    5/2002
(Continued)

OTHER PUBLICATIONS

International Search Report, PCT/US14/42296, Oct. 22, 2014, 3 pages.
(Continued)

*Primary Examiner* — Stanton L Krycinski
(74) *Attorney, Agent, or Firm* — Innovation Counsel LLP

(57) ABSTRACT

A solar panel rack may comprise a vertical support, a transverse support, brackets attaching hollow beams to the transverse support, and brackets configured to attach solar panels or solar panel assemblies to the hollow beams. Internal splices may couple collinearly arranged hollow beams in the solar panel rack. Some or all of these components may be formed from folded sheet metal blanks comprising bend lines predefined by bend-inducing features formed in the blanks. Preformed slots, holes, or other openings in the sheet metal blanks may predefine the relative positions of various components in the solar panel rack and predefine the positions of solar panels or solar panel assemblies to be supported by the solar panel rack. Individual components of the solar panel rack may be useful in other structures and applications apart from solar panel racks.

17 Claims, 22 Drawing Sheets

(51) Int. Cl.
  *F24J 2/52* (2006.01)
  *F16M 11/04* (2006.01)
  *F24J 2/46* (2006.01)

(52) U.S. Cl.
  CPC ............ *F24J 2/5232* (2013.01); *F24J 2/5254* (2013.01); *H01L 31/042* (2013.01); *F24J 2002/4674* (2013.01); *F24J 2002/5215* (2013.01); *Y02B 10/12* (2013.01); *Y02B 10/20* (2013.01); *Y02E 10/47* (2013.01); *Y02E 10/50* (2013.01)

(56) References Cited

U.S. PATENT DOCUMENTS

| | | |
|---|---|---|
| 649,387 A | 5/1900 | Wright et al. |
| 649,762 A | 5/1900 | Saltzkorn et al. |
| 800,365 A | 9/1905 | Ebert |
| 975,121 A | 11/1910 | Carter |
| 1,295,769 A | 2/1919 | Kux |
| 1,405,042 A | 1/1922 | Kraft |
| 1,468,271 A | 9/1923 | Bechtel |
| 1,557,066 A | 10/1925 | Krantz |
| 1,698,891 A | 1/1929 | Overbury |
| 1,699,693 A | 1/1929 | Eisenhauer |
| 1,810,842 A | 9/1929 | Moecker, Jr. |
| 1,746,429 A | 2/1930 | Kelleway |
| 2,127,618 A | 8/1938 | Riemenschneider |
| 2,158,972 A | 5/1939 | Weindel, Jr. |
| 2,339,355 A | 1/1944 | Rutten |
| 2,423,863 A | 7/1947 | Wales |
| 2,480,034 A | 8/1949 | Lapp |
| 2,484,398 A | 10/1949 | Bell et al. |
| 2,512,118 A | 7/1950 | Snow |
| 2,515,067 A | 7/1950 | Wright et al. |
| 2,560,786 A | 7/1951 | Wright et al. |
| 2,577,588 A | 12/1951 | Paige |
| 2,625,290 A | 1/1953 | Kice et al. |
| 2,638,643 A | 5/1953 | Miller |
| 2,771,851 A | 11/1956 | McGregor |
| 2,825,407 A | 3/1958 | Widell |
| 2,869,694 A | 1/1959 | Breckheimer |
| 2,880,032 A | 3/1959 | Bareenyl |
| 2,882,990 A | 4/1959 | Mustoe |
| 2,901,155 A | 8/1959 | Vines |
| 2,916,181 A | 12/1959 | Pfister et al. |
| 2,926,831 A | 3/1960 | Strange |
| 2,947,436 A | 8/1960 | Kappen |
| 2,948,624 A | 8/1960 | Watson et al. |
| 2,976,747 A | 3/1961 | Schatzschock et al. |
| 3,039,414 A | 6/1962 | Rosanes |
| 3,090,087 A | 5/1963 | Miller |
| 3,094,158 A | 6/1963 | Reid |
| 3,094,229 A | 6/1963 | Johnson et al. |
| 3,095,134 A | 6/1963 | Jacke |
| 3,107,041 A | 10/1963 | Wagner |
| 3,107,807 A | 10/1963 | Bergh et al. |
| 3,120,257 A | 2/1964 | Webers et al. |
| 3,129,524 A | 4/1964 | Hayslett |
| 3,135,527 A | 6/1964 | Knapp |
| 3,156,232 A | 11/1964 | Pollock et al. |
| 3,159,156 A | 12/1964 | Incledon |
| 3,191,564 A | 6/1965 | Fraze |
| 3,204,849 A | 9/1965 | Vinney |
| 3,205,600 A | 9/1965 | Snyder |
| 3,216,644 A | 11/1965 | Harrison et al. |
| 3,217,437 A | 11/1965 | Cobb |
| 3,228,710 A | 1/1966 | Chodorowski |
| 3,234,704 A | 2/1966 | Burgess et al. |
| 3,246,796 A | 4/1966 | Englander et al. |
| 3,258,380 A | 6/1966 | Fischer et al. |
| 3,313,080 A | 4/1967 | Gewiss |
| 3,318,301 A | 5/1967 | Schibley |
| 3,341,395 A | 9/1967 | Weber |
| 3,344,641 A | 10/1967 | Pomory |
| 3,353,639 A | 11/1967 | Andrinssi |
| 3,357,078 A | 12/1967 | Moltchan |
| 3,361,320 A | 1/1968 | Bobrowski |
| 3,455,018 A | 7/1969 | Collins |
| 3,457,756 A | 7/1969 | Rohde |
| 3,474,225 A | 10/1969 | Leedy |
| 3,521,536 A | 7/1970 | Waldbauer et al. |
| 3,538,982 A | 11/1970 | Fiori |
| 3,590,759 A | 7/1971 | Hendrie et al. |
| 3,602,373 A | 8/1971 | Cassel |
| 3,626,604 A | 12/1971 | Pierce |
| 3,638,465 A | 2/1972 | Lickliter et al. |
| 3,638,597 A | 2/1972 | Brown |
| 3,666,607 A | 5/1972 | Weissman |
| 3,688,385 A | 9/1972 | Brown |
| 3,717,022 A | 2/1973 | DuBois |
| 3,731,514 A | 5/1973 | Deibele, Jr. |
| 3,756,499 A | 9/1973 | Giebel et al. |
| 3,774,434 A | 11/1973 | Bock |
| 3,776,015 A | 12/1973 | Chartet |
| 3,779,282 A | 12/1973 | Klees |
| 3,788,934 A | 1/1974 | Coppa |
| 3,851,912 A | 12/1974 | Grosseau |
| 3,854,859 A | 12/1974 | Sola |
| 3,862,562 A | 1/1975 | Kruger |
| 3,867,829 A | 2/1975 | Bock |
| 3,878,438 A | 4/1975 | Weisman |
| 3,879,240 A | 4/1975 | Wall |
| 3,882,653 A | 5/1975 | Ollman |
| 3,890,869 A | 6/1975 | Van Cleave |
| 3,907,193 A | 9/1975 | Heller |
| 3,914,974 A | 10/1975 | De Vore |
| 3,938,657 A | 2/1976 | David |
| 3,943,744 A | 3/1976 | Marsh et al. |
| 3,952,574 A | 4/1976 | Speidel |
| 3,963,170 A | 6/1976 | Wood |
| 3,994,275 A | 11/1976 | Williams |
| 4,004,334 A | 1/1977 | Greenley |
| 4,011,704 A | 3/1977 | O'Konski |
| 4,027,340 A | 6/1977 | Hadtke |
| 4,058,813 A | 11/1977 | Risko |
| 4,102,525 A | 7/1978 | Albano |
| 4,120,084 A | 10/1978 | Wallman |
| 4,132,026 A | 1/1979 | Dodds |
| 4,133,198 A | 1/1979 | Huda et al. |
| 4,133,336 A | 1/1979 | Smith |
| 4,141,525 A | 2/1979 | Miller |
| 4,145,801 A | 3/1979 | Schrecker et al. |
| 4,166,565 A | 9/1979 | Webinger |
| 4,170,691 A | 10/1979 | Rogers |
| 4,190,190 A | 2/1980 | Halonen |
| 4,215,194 A | 7/1980 | Shepherd |
| 4,230,058 A | 10/1980 | Iwaki et al. |
| 4,245,615 A | 1/1981 | Moss |
| 4,289,290 A | 9/1981 | Miller |
| 4,305,340 A | 12/1981 | Iwaki et al. |
| 4,327,835 A | 5/1982 | Leger |
| 4,352,843 A | 10/1982 | Eckert |
| 4,362,519 A | 12/1982 | Gault |
| 4,383,430 A | 5/1983 | Klaus |
| 4,401,341 A | 8/1983 | Hirabayashi et al. |
| 4,406,505 A | 9/1983 | Avramovich |
| 4,421,232 A | 12/1983 | Konaka |
| 4,428,599 A | 1/1984 | Jahnie |
| 4,457,555 A | 7/1984 | Draper |
| 4,468,946 A | 9/1984 | Driear |
| 4,469,273 A | 9/1984 | Smith |
| 4,469,727 A | 9/1984 | Loew |
| 4,479,737 A | 10/1984 | Bergh et al. |
| 4,489,976 A | 12/1984 | Flaherty |
| 4,491,362 A | 1/1985 | Kennedy |
| 4,510,785 A | 4/1985 | Trioujeyre et al. |
| 4,515,004 A | 5/1985 | Jaenson |
| 4,542,933 A | 9/1985 | Bischoff |
| 4,557,132 A | 12/1985 | Break |
| 4,558,582 A | 12/1985 | Meinig |
| 4,559,259 A | 12/1985 | Cetrelli |
| 4,596,356 A | 6/1986 | Chaussadas |
| 4,597,374 A | 7/1986 | Igarashi |
| 4,621,511 A | 11/1986 | Knudson |

(56) References Cited

U.S. PATENT DOCUMENTS

| | | |
|---|---|---|
| 4,628,661 A | 12/1986 | St. Louis |
| 4,645,701 A | 2/1987 | Zarrow |
| 4,650,217 A | 3/1987 | Ehrlund |
| 4,672,718 A | 6/1987 | Schlueter et al. |
| 4,676,545 A | 6/1987 | Bonfilio et al. |
| 4,715,502 A | 12/1987 | Salmon |
| 4,735,077 A | 4/1988 | Doring et al. |
| 4,760,634 A | 8/1988 | Rapp |
| 4,792,082 A | 12/1988 | Williamson |
| 4,792,085 A | 12/1988 | Waring, III et al. |
| 4,803,879 A | 2/1989 | Crawford |
| 4,819,792 A | 4/1989 | Christian |
| 4,831,711 A | 5/1989 | Rapp |
| 4,837,066 A | 6/1989 | Quinn et al. |
| 4,869,539 A | 9/1989 | Cassese |
| 4,887,862 A | 12/1989 | Bassi |
| 4,898,326 A | 2/1990 | Edwards et al. |
| 4,950,026 A | 8/1990 | Emmons |
| 4,951,967 A | 8/1990 | Michalik |
| 5,022,804 A | 6/1991 | Peterson |
| 5,077,601 A | 12/1991 | Hatada et al. |
| 5,105,640 A | 4/1992 | Moore et al. |
| 5,148,600 A | 9/1992 | Chen et al. |
| 5,148,900 A | 9/1992 | Mohan |
| 5,157,852 A | 10/1992 | Patrou et al. |
| 5,195,644 A | 3/1993 | Schmid |
| 5,205,476 A | 4/1993 | Sorenson |
| 5,211,047 A | 5/1993 | Kaneyuki |
| 5,211,330 A | 5/1993 | Frey |
| 5,225,799 A | 7/1993 | West et al. |
| 5,227,176 A | 7/1993 | McIntyre-Major |
| 5,234,246 A | 8/1993 | Henigue et al. |
| 5,234,727 A | 8/1993 | Hoberman |
| 5,239,741 A | 8/1993 | Shamos |
| 5,255,969 A | 10/1993 | Cox et al. |
| 5,259,100 A | 11/1993 | Takahashi |
| 5,262,220 A | 11/1993 | Spriggs et al. |
| 5,284,043 A | 2/1994 | Hayashi |
| 5,297,836 A | 3/1994 | Parry-Williams |
| 5,302,435 A | 4/1994 | Hashimoto |
| 5,316,165 A | 5/1994 | Moran, Jr. |
| 5,333,519 A | 8/1994 | Holliday et al. |
| 5,362,120 A | 11/1994 | Cornille, Jr. |
| 5,372,026 A | 12/1994 | Roper |
| 5,377,519 A | 1/1995 | Hayashi |
| 5,378,172 A | 1/1995 | Roberts |
| 5,390,782 A | 2/1995 | Sinn |
| 5,392,629 A | 2/1995 | Goss et al. |
| 5,415,021 A | 5/1995 | Folmer |
| 5,427,732 A | 6/1995 | Shuert |
| 5,432,989 A | 7/1995 | Turek |
| 5,440,450 A | 8/1995 | Lau et al. |
| 5,452,799 A | 9/1995 | Sutherland |
| 5,460,773 A | 10/1995 | Fritz et al. |
| 5,465,929 A | 11/1995 | Dooley |
| 5,466,146 A | 11/1995 | Fritz et al. |
| 5,475,911 A | 12/1995 | Wells et al. |
| 5,496,067 A | 3/1996 | Stolli et al. |
| 5,497,825 A | 3/1996 | Yu |
| 5,524,396 A | 6/1996 | Lalvani |
| 5,533,444 A | 7/1996 | Parks |
| 5,545,026 A | 8/1996 | Fritz et al. |
| 5,568,680 A | 10/1996 | Parker |
| 5,571,280 A | 11/1996 | Lehrer |
| 5,587,914 A | 12/1996 | Conradson et al. |
| 5,592,363 A | 1/1997 | Atarashi et al. |
| 5,615,795 A | 4/1997 | Tipps |
| 5,619,784 A | 4/1997 | Nishimoto et al. |
| 5,620,623 A | 4/1997 | Baker |
| 5,630,469 A | 5/1997 | Butterbaugh et al. |
| 5,640,046 A | 6/1997 | Suzuki et al. |
| 5,660,365 A | 8/1997 | Glick |
| 5,679,388 A | 10/1997 | Fritz et al. |
| 5,692,672 A | 12/1997 | Hunt |
| 5,701,780 A | 12/1997 | Ver Meer |
| 5,704,212 A | 1/1998 | Erler et al. |
| 5,709,913 A | 1/1998 | Andersen et al. |
| 5,725,147 A | 3/1998 | Ljungstrom et al. |
| 5,737,226 A | 4/1998 | Olson et al. |
| 5,740,589 A | 4/1998 | Dominguez |
| 5,789,050 A | 8/1998 | Kang |
| 5,828,575 A | 10/1998 | Sakai |
| 5,855,275 A | 1/1999 | Hunter et al. |
| 5,882,064 A | 3/1999 | Emmons |
| 5,885,676 A | 3/1999 | Lobo et al. |
| 5,932,167 A | 8/1999 | Fritz et al. |
| 6,021,042 A | 2/2000 | Anderson et al. |
| 6,055,788 A | 5/2000 | Martin et al. |
| 6,065,323 A | 5/2000 | Arduino et al. |
| 6,071,574 A | 6/2000 | Weder |
| 6,132,349 A | 10/2000 | Yokoyama |
| 6,144,896 A | 11/2000 | Kask et al. |
| 6,158,652 A | 12/2000 | Ruiz et al. |
| 6,194,653 B1 | 2/2001 | McMiller et al. |
| 6,210,037 B1 | 4/2001 | Brandon, Jr. |
| 6,210,623 B1 | 4/2001 | Fritz et al. |
| 6,220,654 B1 | 4/2001 | Sommer |
| 6,233,538 B1 | 5/2001 | Gupta et al. |
| 6,279,288 B1 | 8/2001 | Keil |
| 6,296,300 B1 | 10/2001 | Sato |
| 6,296,301 B1 | 10/2001 | Schroeder et al. |
| 6,299,240 B1 | 10/2001 | Schroeder et al. |
| 6,330,153 B1 | 12/2001 | Ketonen et al. |
| 6,373,696 B1 | 4/2002 | Bolognia et al. |
| 6,386,009 B1 | 5/2002 | Ni et al. |
| 6,391,424 B1 | 5/2002 | Suzuki |
| 6,400,012 B1 | 6/2002 | Miller et al. |
| 6,412,325 B1 | 7/2002 | Croswell |
| 6,467,475 B2 | 10/2002 | Leutner et al. |
| 6,467,624 B1 | 10/2002 | Lofgren et al. |
| 6,481,259 B1 | 11/2002 | Durney |
| 6,490,498 B1 | 12/2002 | Takagi |
| 6,558,775 B1 | 5/2003 | Suzuki |
| 6,588,244 B2 | 7/2003 | Chevalier |
| 6,592,174 B1 | 7/2003 | Rollin et al. |
| 6,599,601 B2 | 7/2003 | Fogle et al. |
| 6,626,560 B1 | 9/2003 | Caferro et al. |
| 6,631,630 B1 | 10/2003 | Pourboghrat et al. |
| 6,640,599 B1 | 11/2003 | Persson |
| 6,640,605 B2 | 11/2003 | Gitlin et al. |
| 6,643,561 B1 | 11/2003 | Torvinen |
| 6,647,693 B2 | 11/2003 | Bromberg |
| 6,648,159 B2 | 11/2003 | Prutkin et al. |
| 6,658,316 B1 | 12/2003 | Mehta et al. |
| 6,677,562 B2 | 1/2004 | Oshima et al. |
| 6,688,043 B1 | 2/2004 | Feder et al. |
| 6,722,013 B1 | 4/2004 | Rapp |
| 6,728,114 B2 | 4/2004 | Serjack et al. |
| 6,745,608 B2 | 6/2004 | Miura |
| 6,761,502 B2 | 7/2004 | Bishop et al. |
| 6,805,566 B2 | 10/2004 | Chia-Chen |
| 6,821,606 B2 | 11/2004 | Suzuki |
| 6,831,255 B1 | 12/2004 | Levi et al. |
| 6,837,334 B1 | 1/2005 | Le Prevost |
| 6,844,050 B2 | 1/2005 | Noilhan |
| 6,868,708 B2 | 3/2005 | Carlsson et al. |
| 6,877,349 B2 | 4/2005 | Durney et al. |
| 6,917,017 B2 | 7/2005 | Moon et al. |
| 6,936,795 B1 | 8/2005 | Moon et al. |
| 6,940,716 B1 | 9/2005 | Korinsky et al. |
| 6,941,786 B1 | 9/2005 | Cooper et al. |
| 6,986,273 B2 | 1/2006 | Rager et al. |
| 7,000,978 B1 | 2/2006 | Messano |
| 7,014,174 B2 | 3/2006 | Roberts et al. |
| 7,032,426 B2 | 4/2006 | Durney et al. |
| 7,051,768 B2 | 5/2006 | Takahashi |
| 7,069,758 B2 | 7/2006 | Kariakin et al. |
| 7,099,154 B2 | 8/2006 | Ishiyama |
| 7,099,160 B1 | 8/2006 | Ice |
| 7,126,819 B2 | 10/2006 | Liang |
| 7,140,672 B2 | 11/2006 | Chernoff et al. |
| 7,152,449 B2 | 12/2006 | Durney et al. |
| 7,152,450 B2 | 12/2006 | Durney et al. |
| 7,156,200 B2 | 1/2007 | Dershem et al. |

(56) References Cited

U.S. PATENT DOCUMENTS

| | | |
|---|---|---|
| 7,167,380 B2 | 1/2007 | Ice |
| 7,185,934 B2 | 3/2007 | Saeki |
| 7,222,511 B2 | 5/2007 | Durney et al. |
| 7,225,542 B2 | 6/2007 | Chernoff et al. |
| 7,243,519 B1 | 7/2007 | Chuang |
| 7,263,869 B2 | 9/2007 | Durney et al. |
| 7,264,304 B2 | 9/2007 | Carcioffi |
| 7,275,403 B2 | 10/2007 | Meyer |
| 7,281,754 B2 | 10/2007 | Behr |
| 7,296,455 B2 | 11/2007 | Durney |
| 7,327,806 B2 | 2/2008 | Liem |
| 7,331,505 B2 | 2/2008 | Holley et al. |
| 7,350,390 B2 | 4/2008 | Durney et al. |
| 7,354,639 B2 | 4/2008 | Durney et al. |
| 7,374,810 B2 | 5/2008 | Durney et al. |
| 7,412,865 B2 | 8/2008 | Durney |
| 7,440,874 B2 | 10/2008 | Durney et al. |
| 7,464,574 B2 | 12/2008 | Durney et al. |
| 7,503,623 B2 | 3/2009 | Favaretto |
| 7,534,501 B2 | 5/2009 | Durney |
| 7,560,155 B2 | 7/2009 | Durney et al. |
| 7,640,775 B2 | 1/2010 | Durney |
| 7,866,099 B2 | 1/2011 | Komamine et al. |
| 8,052,100 B2 | 11/2011 | Zante et al. |
| 8,114,524 B2 | 2/2012 | Durney |
| 8,377,566 B2 | 2/2013 | Durney |
| 8,495,997 B1 | 7/2013 | Laubach |
| 8,573,545 B2 | 11/2013 | Walquist et al. |
| 8,650,812 B2 | 2/2014 | Cusson |
| 8,667,748 B2 | 3/2014 | Belikoff et al. |
| 8,813,440 B2 | 8/2014 | Potter et al. |
| 8,936,164 B2 | 1/2015 | Durney et al. |
| 8,962,972 B2 | 2/2015 | Sagayama |
| 9,166,521 B2 | 10/2015 | Durney et al. |
| 9,175,881 B2 | 11/2015 | Schrock et al. |
| 2001/0010167 A1 | 8/2001 | Leek |
| 2002/0153371 A1 | 10/2002 | Oshima et al. |
| 2002/0163173 A1 | 11/2002 | Ruehl et al. |
| 2002/0184936 A1 | 12/2002 | Gitlin et al. |
| 2002/0185892 A1 | 12/2002 | Rima et al. |
| 2003/0037586 A1 | 2/2003 | Durney et al. |
| 2003/0062739 A1 | 4/2003 | Bock |
| 2003/0101662 A1 | 6/2003 | Ullman |
| 2003/0104916 A1 | 6/2003 | Suzuki |
| 2004/0035175 A1 | 2/2004 | Karhumaki |
| 2004/0076800 A1 | 4/2004 | Noilhan |
| 2004/0079353 A1 | 4/2004 | Dimitrios |
| 2004/0103707 A1 | 6/2004 | Winters |
| 2004/0130182 A1 | 7/2004 | Bangle et al. |
| 2004/0134250 A1 | 7/2004 | Durney et al. |
| 2004/0206152 A1 | 10/2004 | Durney et al. |
| 2004/0207228 A1 | 10/2004 | Gebreselassie et al. |
| 2005/0005670 A1 | 1/2005 | Durney et al. |
| 2005/0042432 A1 | 2/2005 | Jones et al. |
| 2005/0061049 A1 | 3/2005 | Durney et al. |
| 2005/0064138 A1 | 3/2005 | Durney et al. |
| 2005/0088014 A1 | 4/2005 | Woodson et al. |
| 2005/0097937 A1 | 5/2005 | Durney et al. |
| 2005/0117300 A1 | 6/2005 | Prasher et al. |
| 2005/0120766 A1 | 6/2005 | Friedman et al. |
| 2005/0126110 A1 | 6/2005 | Durney et al. |
| 2005/0161979 A1 | 7/2005 | Chernoff et al. |
| 2005/0167459 A1 | 8/2005 | Storer |
| 2005/0168014 A1 | 8/2005 | Chernoff et al. |
| 2005/0174732 A1 | 8/2005 | Lin |
| 2005/0189790 A1 | 9/2005 | Chernoff et al. |
| 2005/0189791 A1 | 9/2005 | Chernoff et al. |
| 2005/0257589 A1 | 11/2005 | Durney et al. |
| 2005/0284088 A1 | 12/2005 | Heath |
| 2006/0021413 A1 | 2/2006 | Durney et al. |
| 2006/0044755 A1 | 3/2006 | Ishiyama |
| 2006/0053857 A1 | 3/2006 | Durney |
| 2006/0059807 A1 | 3/2006 | Zimmerman et al. |
| 2006/0061966 A1 | 3/2006 | Korinsky et al. |
| 2006/0075798 A1 | 4/2006 | Durney et al. |
| 2006/0096100 A1 | 5/2006 | Stol et al. |
| 2006/0130551 A1 | 6/2006 | Durney et al. |
| 2006/0175871 A1 | 8/2006 | Eipper et al. |
| 2006/0181846 A1 | 8/2006 | Farnsworth et al. |
| 2006/0207212 A1 | 9/2006 | Durney |
| 2006/0213245 A1 | 9/2006 | Durney |
| 2006/0232052 A1 | 10/2006 | Breed |
| 2006/0232934 A1 | 10/2006 | Kusamoto et al. |
| 2006/0237996 A1 | 10/2006 | Eipper et al. |
| 2006/0261139 A1 | 11/2006 | Durney |
| 2006/0277965 A1 | 12/2006 | Durney |
| 2007/0113614 A1 | 5/2007 | Durney et al. |
| 2007/0117502 A1 | 5/2007 | Kim |
| 2007/0123113 A1 | 5/2007 | Durney |
| 2007/0146988 A1 | 6/2007 | Yamagishi et al. |
| 2007/0206353 A1 | 9/2007 | Boone et al. |
| 2007/0231062 A1 | 10/2007 | Durney |
| 2007/0241587 A1 | 10/2007 | Fleming |
| 2007/0262128 A1 | 11/2007 | Durney |
| 2007/0271793 A1 | 11/2007 | Mellis et al. |
| 2007/0286722 A1 | 12/2007 | Lan |
| 2008/0016937 A1 | 1/2008 | Durney et al. |
| 2008/0048366 A1 | 2/2008 | Durney |
| 2008/0054683 A1 | 3/2008 | Takeda |
| 2008/0063834 A1 | 3/2008 | Durney et al. |
| 2008/0079201 A1 | 4/2008 | Durney |
| 2008/0098787 A1 | 5/2008 | Durney |
| 2008/0121009 A1 | 5/2008 | Durney et al. |
| 2008/0187427 A1 | 8/2008 | Durney |
| 2008/0193714 A1 | 8/2008 | Durney et al. |
| 2008/0250837 A1 | 10/2008 | Durney |
| 2008/0251115 A1 | 10/2008 | Thompson et al. |
| 2008/0271511 A1 | 11/2008 | Durney et al. |
| 2008/0276682 A1 | 11/2008 | Durney |
| 2009/0100893 A1 | 4/2009 | Durney et al. |
| 2009/0100894 A1 | 4/2009 | Durney et al. |
| 2009/0100895 A1 | 4/2009 | Durney et al. |
| 2009/0194089 A1 | 8/2009 | Durney et al. |
| 2009/0205387 A1 | 8/2009 | Durney et al. |
| 2009/0297740 A1 | 12/2009 | Durney |
| 2010/0116324 A1 | 5/2010 | O'Brien et al. |
| 2010/0201158 A1 | 8/2010 | Miyashita |
| 2010/0243827 A1 | 9/2010 | Zante et al. |
| 2010/0276558 A1 | 11/2010 | Faust et al. |
| 2011/0008573 A1 | 1/2011 | Durney |
| 2011/0192098 A1 | 8/2011 | Chung |
| 2011/0265860 A1 | 11/2011 | Ciasulli et al. |
| 2011/0287228 A1 | 11/2011 | Durney et al. |
| 2012/0031859 A1 | 2/2012 | Zante et al. |
| 2012/0085395 A1 | 4/2012 | Kuster et al. |
| 2012/0090665 A1 | 4/2012 | Zuritis |
| 2012/0124922 A1 | 5/2012 | Cusson et al. |
| 2012/0273031 A1 | 11/2012 | Sagayama |
| 2012/0285515 A1 | 11/2012 | Sagayama |
| 2013/0032200 A1 | 2/2013 | Schnitzer et al. |
| 2013/0048056 A1 | 2/2013 | Kilgore et al. |
| 2013/0091786 A1 | 4/2013 | Dupont et al. |
| 2013/0092215 A1 | 4/2013 | Schroeder et al. |
| 2013/0125959 A1 | 5/2013 | Sagayama et al. |
| 2015/0064067 A1 | 3/2015 | Durney |
| 2015/0090680 A1 | 4/2015 | Durney et al. |

FOREIGN PATENT DOCUMENTS

| | | |
|---|---|---|
| DE | 202008001010 U1 | 5/2008 |
| DE | 102009019829 A1 | 11/2010 |
| DE | 202011001320 U1 | 5/2011 |
| DE | 102011114976 A1 | 4/2013 |
| EP | 2146160 A1 | 1/2010 |
| EP | 2362161 A1 | 8/2011 |
| FR | 2971838 A1 | 8/2012 |
| FR | 2983890 A1 | 6/2013 |
| JP | 4688951 B1 | 5/2011 |
| WO | 2007/038760 A2 | 4/2007 |

(56) References Cited

FOREIGN PATENT DOCUMENTS

| WO | 2007/134114 A2 | 11/2007 |
| WO | 2008/124642 A2 | 10/2008 |
| WO | 2010/006735 A2 | 1/2010 |

OTHER PUBLICATIONS

Derwent Abstract Accession No. 1995-280162/37, M21, JP 3474242 B2 (Amada Co Ltd) Dec. 8, 2003.
Derwent Abstract Accession No. 1999-340844/29, P52, JP 11 123458 A (Meiji Nat Kogyo KK) May 11, 1999.
Derwent Abstract Accession No. 80-C6243C/12, FR 2428372 A (Merlin & Gerin SA) Feb. 8, 1980.
Derwent Abstract Accession No. 83-G2401K/19, FR 2514103 A (GRUN) Apr. 8, 1983.
Derwent Abstract Accession No. 97-345802/32, P52, JP 9 141333 A (Kokusai Denki KK) Jun. 3, 1997.
Derwent Abstract Accession No. 98-265616/24, P52, JP 10 085837 A (Mitsubishi Electric Corp) Apr. 7, 1998.
EasyBend™—Complex Bending Made Easy, © 2004 Mate Precision Tooling Inc., Anoka, Minnesota.
Patent Abstracts of Japan, vol. 015, No. 006 (M-1066), Jan. 8, 1991 (JP 02-258116A).
Publication "Office dA" by Contemporary World Architects, Rockport Publishers, Inc., Gloucester, Massachusetts, 2000, pp. 15, 20-35.
"Hold the Press", Eureka Magazine, Aug. 2007, vol. 27, No. 8, Findlay Publications Ltd., Darford Kent UK, pp. 12-13.
Snap to it, International Sheet Metal Review, Sep./Oct. 2005, p. 40-42.
SnapLock™—Fabricated Joints Without Welding, ©2002 Mate Precision Tooling, Inc., Anoka, Minnesota.
Singh, H., "Sheet Metal Hydroforming", Fundamentals of Hydroforming, Society of Manufacturing Engineers, Dearborn, Michigan (2003), pp. 29-35.
International Search Report corresponding to PCT/US2013/048695, Sep. 30, 2013, 6 pages.
Written Opinion of the International Searching Authority corresponding to PCT/US2013/048695, Sep. 30, 2013, 8 pages.
U.S. Appl. No. 11/927,341, filed Oct. 29, 2007, Durney et al.
U.S. Appl. No. 11/927,608, filed Oct. 29, 2007, Durney.
U.S. Appl. No. 11/927,626, filed Oct. 29, 2007, Durney et al.
U.S. Appl. No. 11/928,074, filed Oct. 30, 2007, Durney.
U.S. Appl. No. 11/928,433, filed Oct. 30, 2007, Durney et al.
U.S. Appl. No. 11/928,596, filed Oct. 30, 2007, Durney.
U.S. Appl. No. 11/929,094, filed Oct. 30, 2007, Durney et al.
U.S. Appl. No. 11/929,201, filed Oct. 30, 2007, Durney.
U.S. Appl. No. 11/929,747, filed Oct. 30, 2007, Durney.
U.S. Appl. No. 11/929,780, filed Oct. 30, 2007, Durney et al.
U.S. Appl. No. 11/930,058, filed Oct. 30, 2007, Durney et al.
U.S. Appl. No. 12/250,515, filed Oct. 13, 2008, Durney et al.

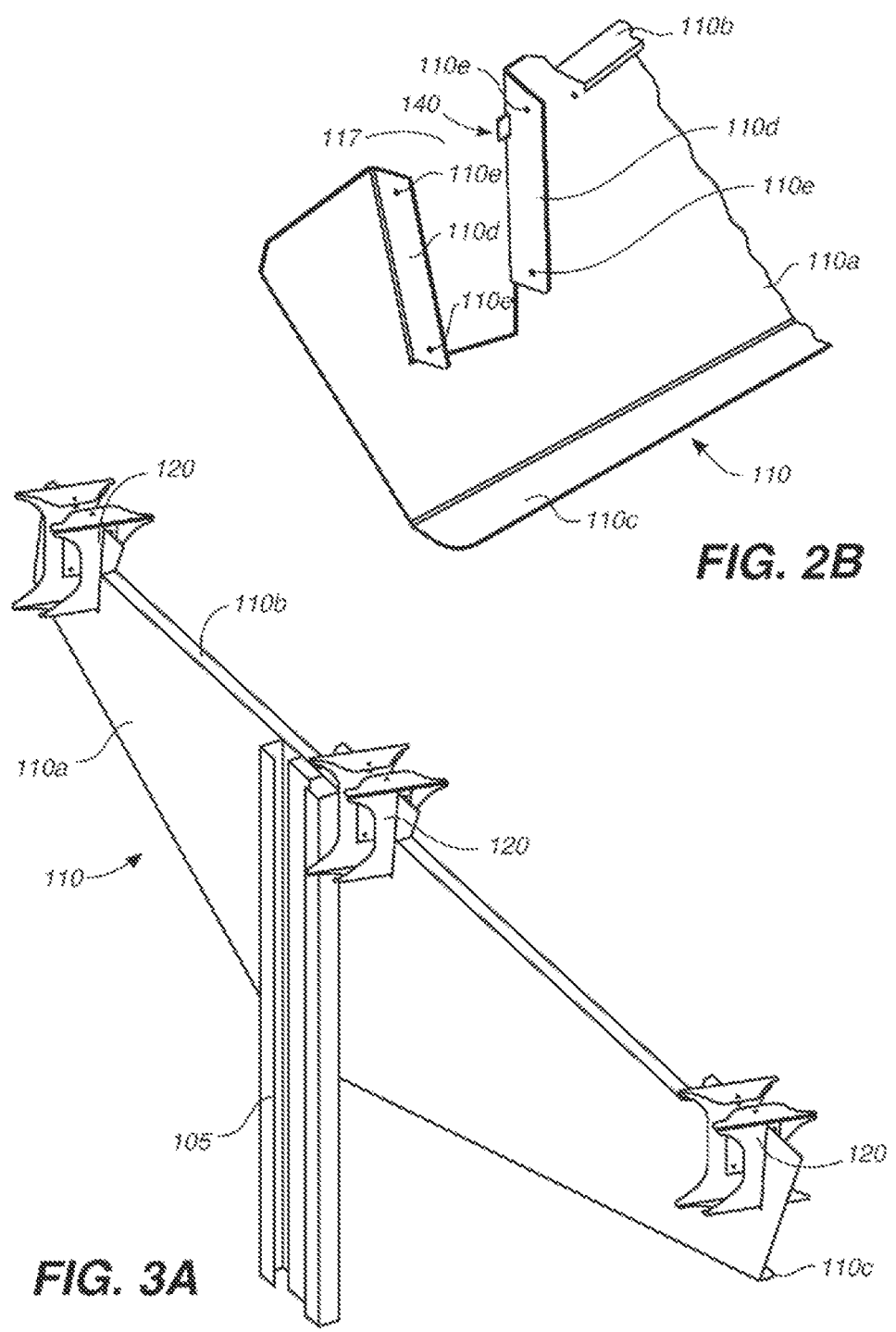

SOLAR PANEL RACK

CROSS REFERENCE TO RELATED APPLICATIONS

This application is a Continuation of U.S. patent application Ser. No. 14/563,600 titled "Solar Panel Rack" and filed Dec. 8, 2014, which is a Continuation of U.S. patent application Ser. No. 13/543,569 titled "Solar Panel Rack" and filed Jul. 6, 2012 (now U.S. Pat. No. 8,936,164), each of which is incorporated herein by reference in its entirety.

FIELD OF THE INVENTION

The invention relates generally to the collection of solar energy, and more particularly to solar panel mounting racks and their components.

BACKGROUND

Ground-mounted photovoltaic solar panels are conventionally supported on solar panel mounting racks. Commercially available solar panel racks are typically produced using aluminum extruded sections or steel roll formed sections in order to provide the structural strength required to withstand loads associated with outside conditions such as wind and snow.

SUMMARY

Solar panel racks, their components, and related methods by which the solar panel racks may be manufactured, assembled, and used are disclosed.

A solar panel rack comprises two or more hollow sheet metal beams arranged side by side and in parallel with each other to define a plane, a transverse support comprising two or more notches located in its upper edge, and two or more first sheet metal brackets. The plane defined by the hollow sheet metal beams may be, for example, located parallel to and above upper surfaces of the hollow sheet metal beams. Each first sheet metal bracket has an outer cross-sectional shape substantially conforming to an inner cross-sectional shape of a corresponding notch in the transverse support, has an inner cross-sectional shape substantially conforming to the outer-cross sectional shape of a corresponding hollow sheet metal beam, is positioned in the corresponding notch in the transverse support, and is attached to and supports the corresponding hollow sheet metal beam at least partially within the corresponding notch in the transverse support. The solar panel rack also comprises one or more second sheet metal brackets, each of which has an inner cross-sectional shape substantially conforming to the outer cross-sectional shape of a corresponding hollow sheet metal beam, is positioned on and attached to the corresponding hollow sheet metal beam, and is configured to couple to a solar panel or solar panel assembly to position and attach the solar panel or solar panel assembly to the solar panel rack in a desired location in the plane defined by the hollow sheet metal beams.

The hollow sheet metal beams may be formed by bending sheet metal blanks along bend lines predefined in the sheet metal blanks by bend-inducing features. In some variations, the bend-inducing features each have a length A and each have a radius of curvature R at each end, where R is approximately a minimum radius of curvature required to prevent cracking at ends of the bend-inducing features upon bending of the blank along the bend lines, and A is less than or equal to about 6R, or A is greater than or equal to about 2R and less than or equal to about 6R.

Sheet metal blanks from which the hollow sheet metal beams are formed may comprise preformed tabs and slots configured to secure the sheet metal blank in its beam configuration upon bending of the blank into the beam configuration. In addition, or alternatively, the sheet metal blanks may comprise preformed slots or other openings configured to predefine the locations at which other components of the solar panel rack are attached to the hollow sheet metal beams. These preformed slots or other openings may thereby also predefine the locations at which solar panels or solar panel assemblies are to be attached to the solar panel rack.

The transverse support may be formed by bending a sheet metal blank along bend lines predefined in the sheet metal blank by bend-inducing features. A sheet metal blank from which a transverse support is formed may comprise one or more preformed tabs or slots configured to engage one or more corresponding slots or tabs in a first sheet metal bracket to at least partially secure the first sheet metal bracket in position on the transverse support. The transverse support may comprise flanges that form side walls for the notches in the upper edge of the transverse support, and such flanges on opposite sides of a notch may be attached to opposite sides of a first sheet metal bracket positioned in the notch.

The first sheet metal brackets may be formed by bending sheet metal blanks along bend lines predefined in the sheet metal blanks by bend-inducing features. A sheet metal blank from which a first sheet metal bracket is formed may comprise one or more preformed tabs or slots configured to engage one or more corresponding slots or tabs in the transverse support to at least partially secure the first sheet metal bracket in position on the transverse support. Each first sheet metal bracket may extend beyond the transverse support in both directions along its corresponding hollow sheet metal beam, and be configured to be progressively less stiff with increasing distance from the transverse support. Each first sheet metal bracket may comprise upper flanges configured to be closed around a hollow sheet metal beam to capture the hollow sheet metal beam within the first sheet metal bracket. The first sheet metal brackets may be initially formed with their upper flanges in an unbent, open configuration to allow positioning of hollow sheet metal beams within the first sheet metal brackets, after which the upper flanges may be closed to capture the hollow sheet metal beams within the first sheet metal bracket. Alternatively, the first sheet metal brackets may be initially formed with their upper flanges in a bent, closed position. In the latter case, the upper flanges may be opened to allow positioning of a hollow sheet metal beam within the first sheet metal bracket and then closed to capture the hollow sheet metal beam.

The second sheet metal brackets may be formed by bending sheet metal blanks along bend lines predefined in the sheet metal blanks by bend-inducing features. Each second sheet metal bracket may comprise one or more upwardly pointing tabs configured to contact features on a solar panel or solar panel assembly to position the solar panel or solar panel assembly in a desired location. Each second sheet metal bracket may additionally, or alternatively, comprise one or more upwardly pointing tabs configured to be clinched to features on a solar panel or solar panel assembly to attach the solar panel or solar panel assembly to the solar panel rack. A pair of two such clinching tabs may be configured to be simultaneously clinched to attach two solar panels or solar panel assemblies to the solar panel rack at the same time.

The solar panel rack may also comprise a hollow sheet metal beam arranged collinearly with one of the two or more side-by-side hollow sheet metal beams, and an expandable and collapsible sheet metal splice. The expandable and collapsible sheet metal splice may be formed by bending a sheet metal blank along bend lines predefined in the sheet metal blank by bend-inducing features. The expandable and collapsible sheet metal splice is configured to be bent along predefined bend lines to assume a collapsed configuration. While in the collapsed configuration, the splice may be inserted into adjoining ends of the collinear hollow sheet metal beams. The splice may then be expanded to a configuration having an outer cross-sectional shape conforming to and tightly fitting an internal cross-sectional shape of the collinear hollow sheet metal beams, and attached to both of the collinear hollow sheet metal beams to couple the collinear hollow sheet metal beams to each other.

Solar panel racks, their components, and related manufacturing and assembly methods disclosed herein may advantageously reduce material, manufacturing and installation costs for solar panel systems. This may result from a reduced amount of material used in the solar panel rack design, the use of cost-effective manufacturing methods, reduced shipping costs of solar panel rack components, which may be shipped to an installation site as substantially flat sheet metal blanks prior to bending to form the components, reduced storage space required for the components, and reduced labor requirements for installing the solar racks and/or an increased rate of installation.

These and other embodiments, features and advantages of the present invention will become more apparent to those skilled in the art when taken with reference to the following more detailed description of the invention in conjunction with the accompanying drawings that are first briefly described.

BRIEF DESCRIPTION OF THE DRAWINGS

FIGS. 2A-2B show a transverse support in an example solar panel rack (FIG. 2A) and an expanded view (FIG. 2B) of a notch in the transverse support configured to receive and attach to a beam bracket that is configured to attach a longitudinal beam to the transverse support.

FIGS. 3A-3C show beam brackets attached to and positioned in notches in a transverse support (FIG. 3A), an expanded view of a beam bracket positioned in a notch with its upper flanges open to receive a longitudinal beam (FIG. 3C), and an expanded view of a bracket positioned in a notch with the bracket's upper flanges closed (FIG. 3B).

DETAILED DESCRIPTION

The following detailed description should be read with reference to the drawings, in which identical reference numbers refer to like elements throughout the different figures. The drawings, which are not necessarily to scale, depict selective embodiments and are not intended to limit the scope of the invention. The detailed description illustrates by way of example, not by way of limitation, the principles of the invention. This description will clearly enable one skilled in the art to make and use the invention, and describes several embodiments, adaptations, variations, alternatives and uses of the invention, including what is presently believed to be the best mode of carrying out the invention.

As used in this specification and the appended claims, the singular forms "a," "an," and "the" include plural referents unless the context clearly indicates otherwise. Also, the term "parallel" is intended to mean "parallel or substantially parallel" and to encompass minor deviations from parallel geometries rather than to require that any parallel arrangements described herein be exactly parallel. Similarly, the term "perpendicular" is intended to mean "perpendicular or substantially perpendicular" and to encompass minor deviations from perpendicular geometries rather than to require that any perpendicular arrangements described herein be exactly perpendicular.

This specification discloses solar panel mounting racks, their components, and related methods by which the solar panel racks may be manufactured, assembled, and used. As illustrated in the various figures, the disclosed solar panel racks may be used, for example, in a ground-mounted configuration to support photovoltaic panels in fixed positions to collect and convert solar radiation to electricity. Other configurations and applications for the disclosed solar racks will also be described below.

Various components of the disclosed solar panel racks including, for example, the hollow beams, beam brackets, internal expandable beam splices, and solar panel brackets further described below, may be advantageously used in other structures unrelated to solar panels or to the collection of solar energy. The discussion of these components in relation to their roles in the disclosed solar panel rack is not intended to limit the scope of their potential use.

Figure 1A:
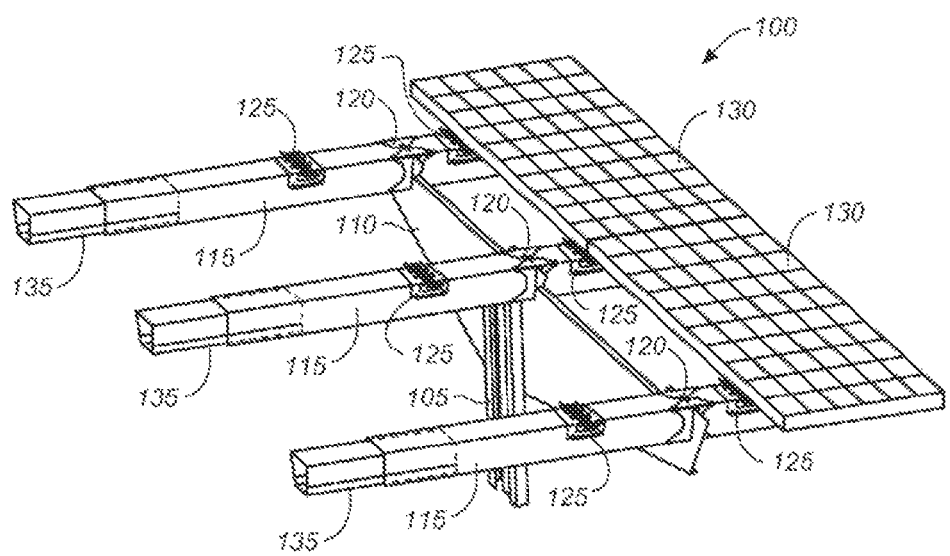
FIGS. 1A-1C show several views of a portion of an example solar panel rack with solar panels mounted on the rack (FIGS. 1A, 1B) and without solar panels mounted on the rack (FIG. 1C).
Figure 1B:
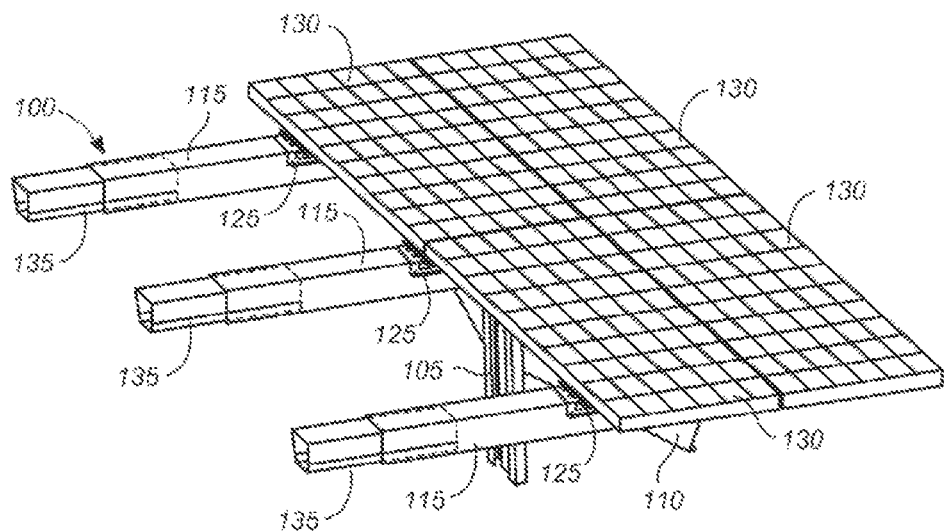
Figure 1C:
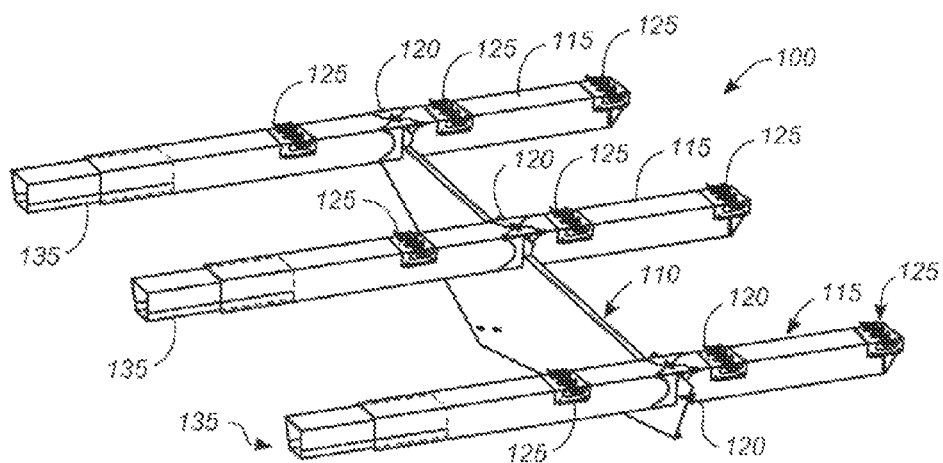

Referring now to FIGS. 1A-1C, an example solar panel rack 100 comprises a vertical support 105, a transverse support 110 attached to an upper portion of the vertical support, and three hollow beams 115 supported by transverse support 110. Hollow beams 115 are arranged in parallel orientations, with their upper surfaces defining a plane in which solar panels are to be supported. In the illustrated example, hollow beams 115 are secured in notches 117 (FIG. 2A) in transverse support 110 by beam brackets 120. Panel brackets 125, attached to hollow beams 115, are configured to attach solar panels 130 to the upper surfaces of beams 115.

Although the illustrated solar panel rack comprises three parallel hollow beams, more generally the solar panel rack comprises two or more parallel hollow beams arranged to define a plane in which solar panels are to be supported. Transverse support 110 and hollow beams 115 may be configured so that the plane in which the solar panels are supported is tilted with respect to vertical, rather than oriented horizontally. The tilt angle may be selected to allow the solar panels to better collect solar energy. (In this specification, "vertical" indicates the direction opposite to the force of the Earth's gravity). For example, and as illustrated, vertically oriented substantially identical notches 117 in the upper edge of transverse support 110 may be located to secure the beams 115 at progressively varying heights so that the beams can define a plane having a desired tilt angle. Further, beams 115 may have non-rectangular cross-sections (FIG. 6D) such that flat upper surfaces of the hollow beams are angled with respect to the vertical to define the desired tilted plane. The upper edge of transverse support 110 may be angled substantially parallel to the intended plane of the solar panels, as illustrated, to provide clearance for the solar panels.

The portion of the example solar panel rack illustrated in FIGS. 1A-1C may be repeated as a unit to form a linearly extending, modular, solar panel rack of desired length. In such linearly extending solar panel racks, corresponding hollow beams in adjacent repeating units may be arranged collinearly and spliced together with internal expandable splices 135 as further described below. Two or more such linearly extending solar panel racks may be arranged in parallel and side-by-side to support two or more corresponding spaced-apart rows of solar panels in an array of solar panels.

Individual solar panels to be supported by solar panel rack 100 may have, for example, a width of about 0.9 meters to about 1.3 meters and a length of about 1.5 meters to about 2.5 meters. More generally, such solar panels may have any suitable dimensions. The width of the solar panel rack may be selected, for example, to be approximately equal to an integer multiple of the solar panel width or length, or to a sum of integer multiples of the solar panel width and the solar panel length. As illustrated, for example, the solar panel rack may have a width approximately equal to twice the length of a solar panel. More generally, solar panel rack 100 may have any suitable width. Solar panels may be grouped into assemblies of solar panels prior to being installed on solar panel rack 100. Such a solar panel assembly may be handled and installed similarly to as described herein for an individual solar panel.

Beams 115 may have lengths of, for example, about 3 meters to about 8 meters. The beam lengths may be selected, for example, to be approximately equal to an integer multiple of the solar panel width or length, or to a sum of integer multiples of the solar panel width and the solar panel length. Two or more beams 115 may be spliced together as noted above to form part of a solar panel rack having an overall length of, for example, about 24 meters to about 96 meters supported by multiple transverse supports 110 and corresponding vertical supports 105. Though FIGS. 1A-1C show a single transverse support used to support one beam-length of solar panel, in other variations two or more transverse supports 110, with corresponding vertical supports 105, may be spaced along a beam-length of the solar panel. For example, in linearly extending solar panel racks comprising beams collinearly spliced together to lengthen the rack, there may be one, two, or more than two transverse supports spaced along the solar panel rack between beam splices or between the end of the solar panel rack and a beam splice.

Although the example solar panel rack of FIGS. 1A-1C is shown comprising a vertical support, a transverse support, hollow beams, brackets for attaching the hollow beams to the transverse support, and brackets for attaching the solar panels to the hollow beams, variations of the solar panel rack may lack any one of these components, or lack any combination of these components, and may comprise additional components not shown.

Transverse supports, hollow beams, and brackets used in the solar panel racks disclosed in this specification may advantageously be formed by bending sheet metal blanks into the desired shape. Flat sheet metal blanks from which these components are formed may be patterned, for example, with slits, grooves, score lines, obround holes, or similar bend-inducing features that define predetermined bend lines along which the sheet metal blanks may be bent to form the desired structures.

Such bend-inducing features may include, for example, slits, grooves, displacements, and related bend-inducing features as disclosed in U.S. Pat. No. 6,877,349, U.S. Pat. No. 7,152,449, U.S. Pat. No. 7,152,450, U.S. Pat. No. 7,350,390, and U.S. Patent Application Publication No. 2010/0122,563, all of which references are incorporated herein by reference in their entirety. A "displacement" as disclosed in these references is a bend-inducing feature comprising a tongue of material defined in a sheet metal blank by a cut or sheared edge located on or adjacent the bend line, with the tongue displaced at least partially out of the plane of the sheet metal blank before the sheet metal blank is bent along that bend line. The use of bend-inducing features, particularly those disclosed in these references, may increase the precision with which the sheet metal blanks may be bent into the desired components and reduce the force necessary to bend the blanks. The bend-inducing features disclosed in the cited references may exhibit edge-to-face engagement, as described in the references, upon bending. Such edge-to-face engagement may contribute to the precision with which bending may be accomplished and to the stiffness and strength of the resulting component.

Example flat sheet metal blanks from which hollow beams 115 may be formed in some variations are illustrated in FIGS. 6A-6J and described below. For other components of solar panel rack 100 for which no corresponding flat sheet metal blank with bend-inducing features is illustrated, the predetermined bend lines defined by bend inducing features in such sheet metal blanks should be understood to be located at positions corresponding to the bends evident in the finished structures shown in the drawings.

In some variations, transverse supports, hollow beams, and/or brackets used in the solar panel may be formed from sheet metal blanks without the use of bend-inducing features to pre-define the bend lines. In such variations, the sheet metal blanks may be bent into the desired shape using, for example, conventional press-brake, stamping press, or roll-forming technology.

Sheet metal blanks for the components of solar panel rack 100, including bend-inducing features if used, may be formed using laser cutting, computer numerical controlled (CNC) metal punching, and/or metal stamping, for example. Such techniques allow for low cost manufacturing of the components.

The use of sheet metal components in solar panel rack 100 allows such components to be attached to each other using sheet metal screws or other sheet metal fasteners, rather than with double sided bolt/washer/nut fastener assemblies which can be difficult and slow to install. The single sided installation process of driving a sheet metal screw using, for example, a magnetic electric drive attachment may be advantageous for both the reduced cost of the fasteners and the increased ease and speed of installation. The use of sheet metal components as described herein may also reduce the overall amount and weight of material used in the solar panel racks while maintaining desired stiffness and strength. Nevertheless, as suitable, one or more components not formed from bent sheet metal, such as cast, extruded, or machined components, for example, may be substituted for the sheet metal components otherwise described in this specification.

The individual components of the example solar panel rack 100 of FIGS. 1A-1C are next described in further detail with respect to additional drawings.

Referring again to FIGS. 1A-1C, vertical support 105 may be, for example, any conventional pile or post suitable for supporting solar panel rack 100 and may be formed from any suitable material. Vertical support 105 may have a Σ (sigma) cross section, for example. Although FIGS. 1A-1C show only one vertical support 105 attached to transverse support 110, other variations of the solar panel rack may use two or more such vertical supports spaced apart and attached to transverse support 110. For ground-mounted configurations, vertical support 105 may be, for example, driven into the ground, ballasted with respect to the ground, screwed into the ground, or affixed to or upon the ground by any other suitable means.

As illustrated in the various figures, transverse support 110 has a saddle shape selected to reduce the amount of material necessary to provide sufficient strength and stiffness to support beams 115 and solar panels 130. As noted above, notches 117 in the upper edge of transverse support 110 are configured to receive brackets 120 and beams 115. Any other suitable shape or configuration for transverse support 110 may also be used.

Transverse support 110 may be attached to vertical support 105 using bolt/washer/nut assemblies or any other suitable fasteners or method. Attachment may be accomplished, for example, with suitable fasteners passing through vertical slots in vertical support 105 and through horizontal slots in transverse support 110. Alternatively, attachment may be accomplished, for example, with suitable fasteners passing through horizontal slots in vertical support 105 and through vertical slots in transverse support 110. Such arrangements of vertical and horizontal slots provide an adjustment that may be used to compensate for imprecision in the placement of vertical support 105 with respect to other vertical supports in the solar panel rack.

Figure 2A:
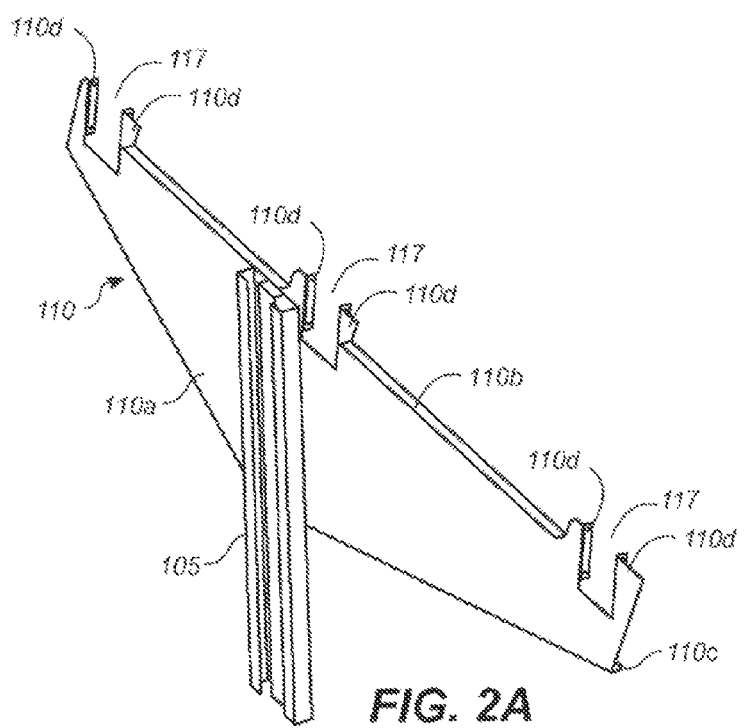
Figure 3B:
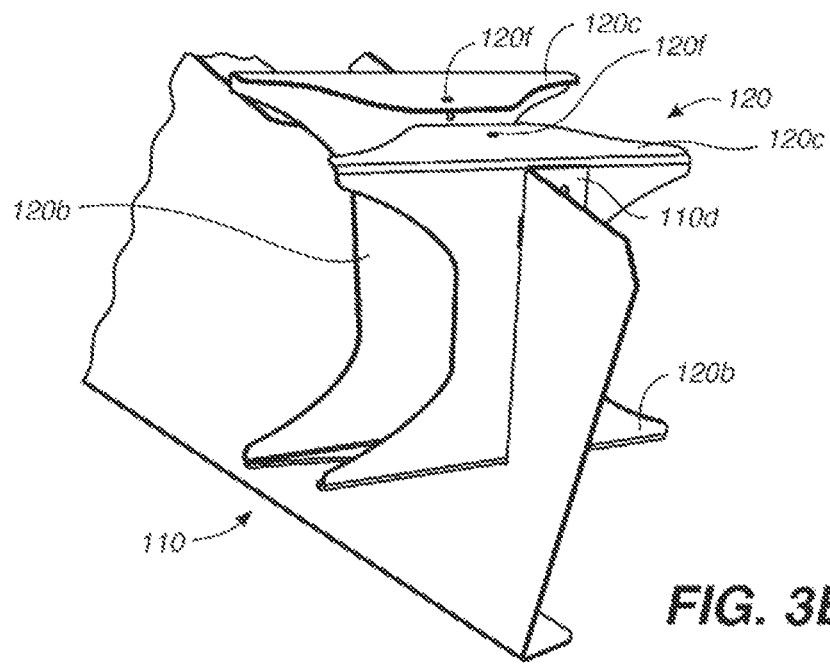
Figure 3C:
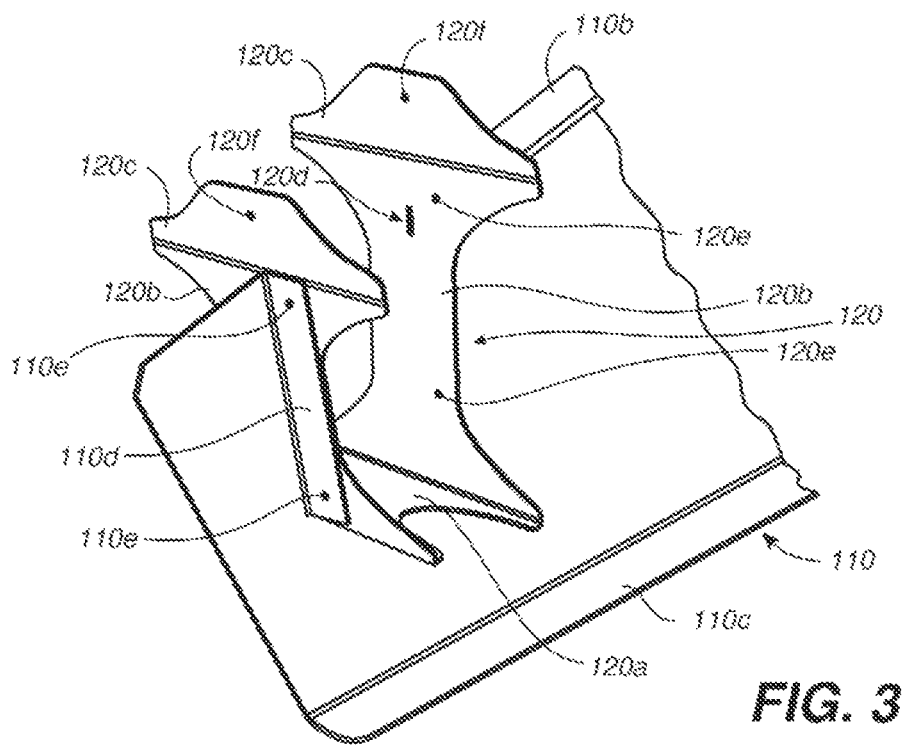
Figure 4A:
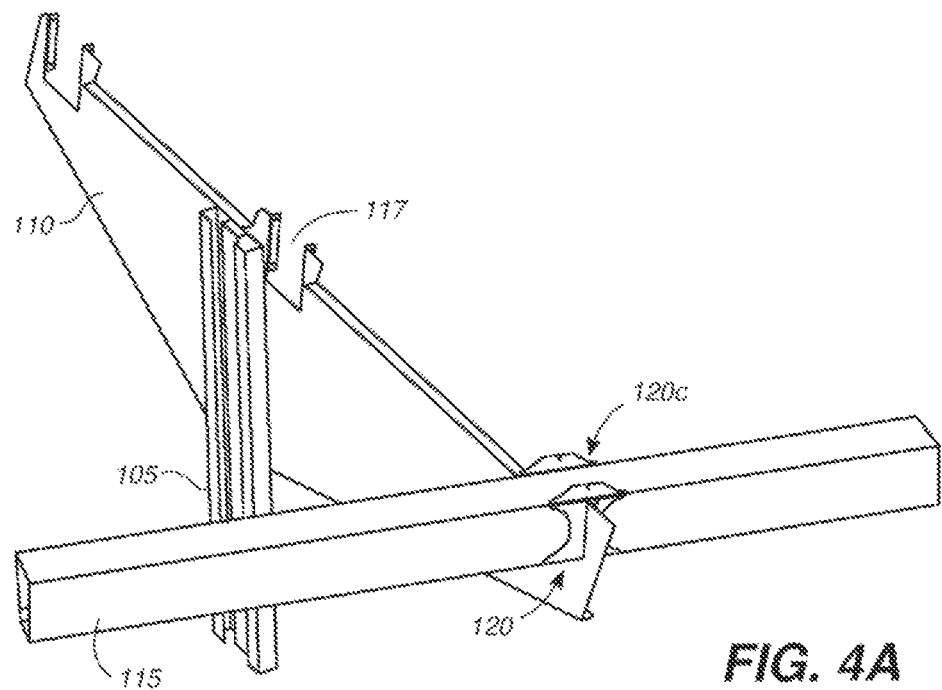
FIGS. 4A-4C show longitudinal beams positioned in beam brackets attached to a transverse support, with the upper flanges of the beam brackets open (FIG. 4A) and closed (FIGS. 4B, 4C) to secure the longitudinal beams to the transverse support.
Figure 4B:
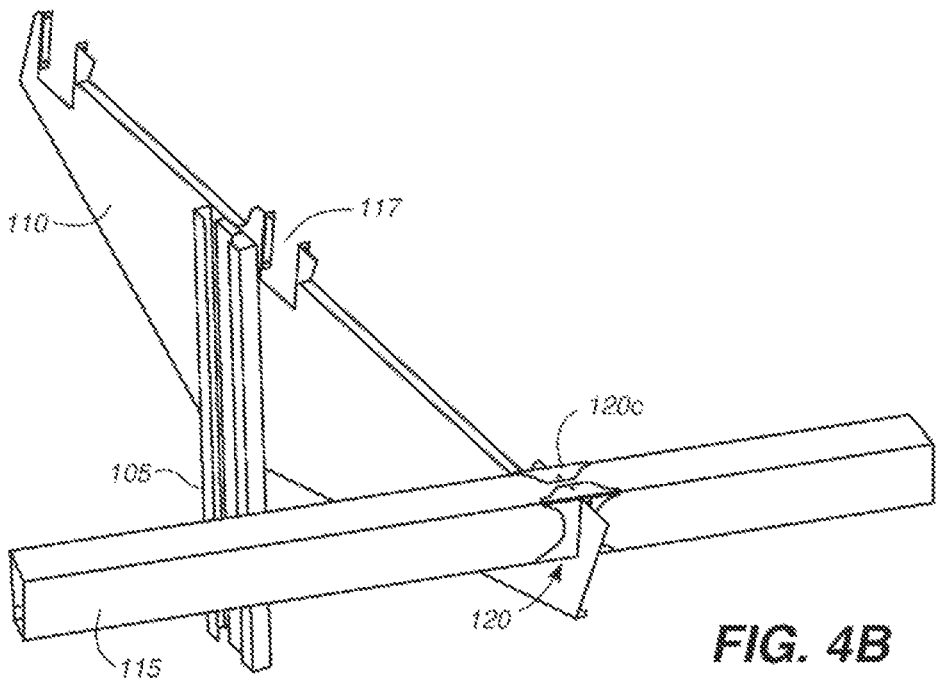
Figure 4C:
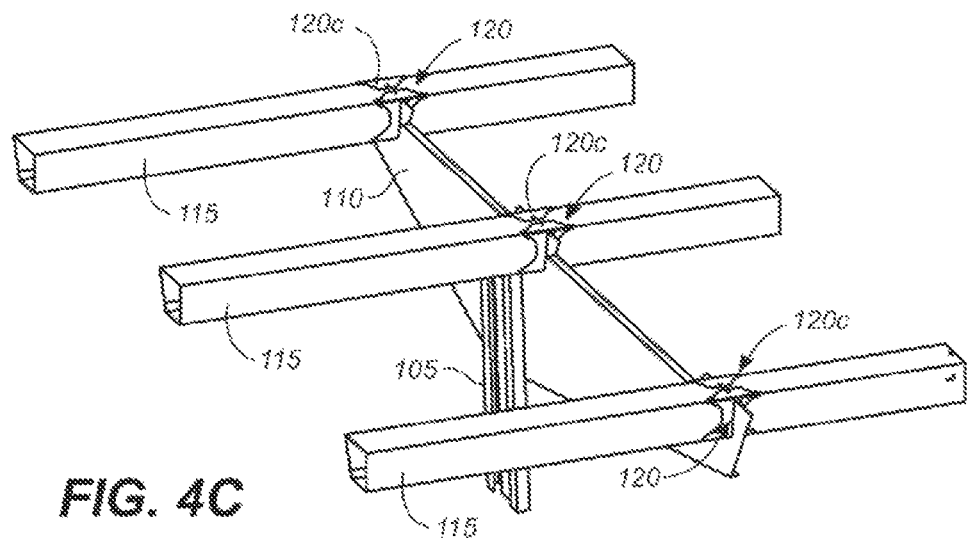
Figure 5A:
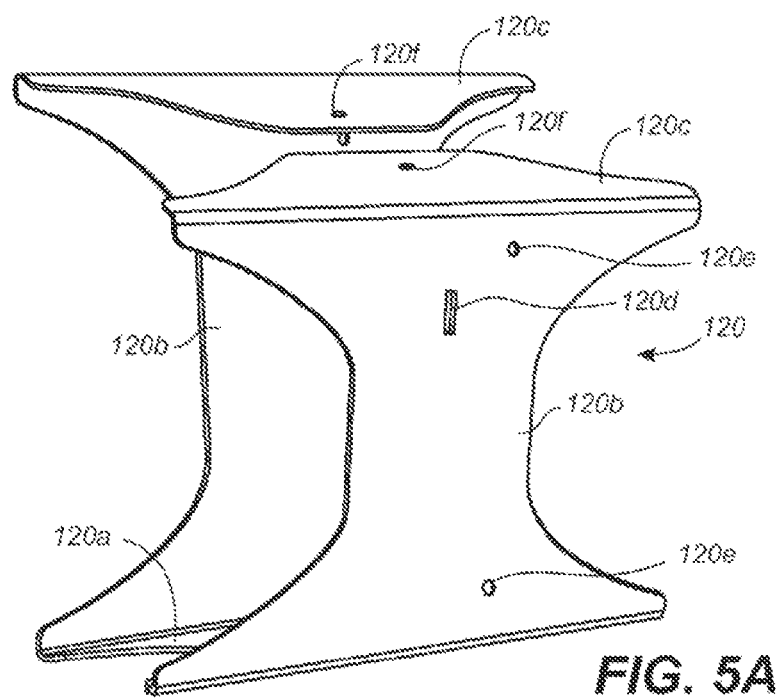
FIGS. 5A-5D show several views of a beam bracket configured to attach longitudinal beams to transverse support structures in the example solar panel rack.
Figure 5B:
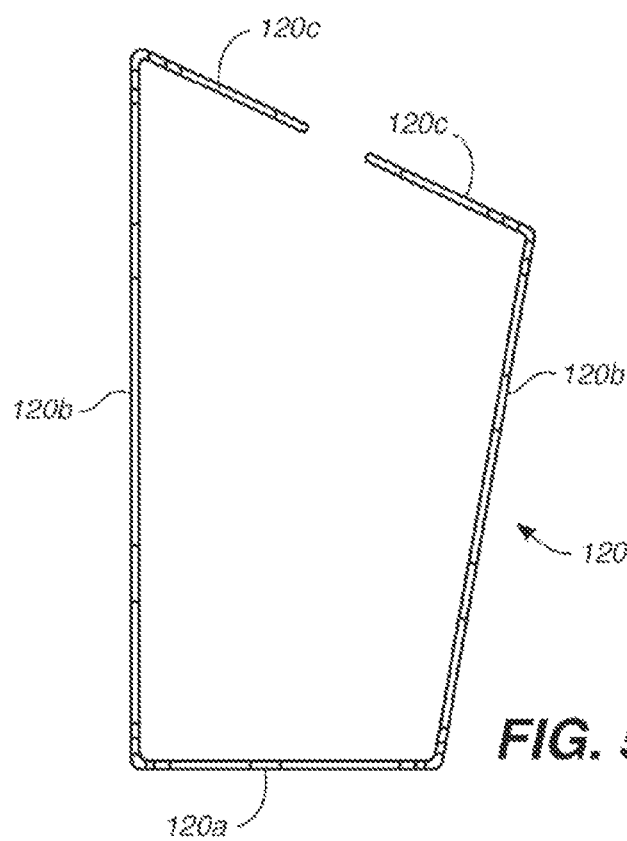
Figure 5C:
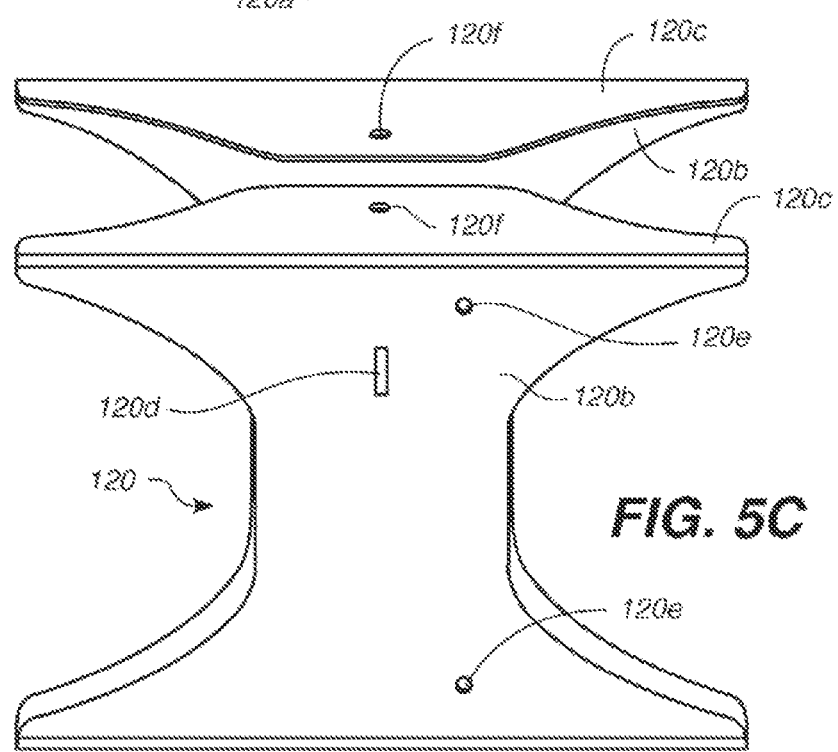
Figure 5D:
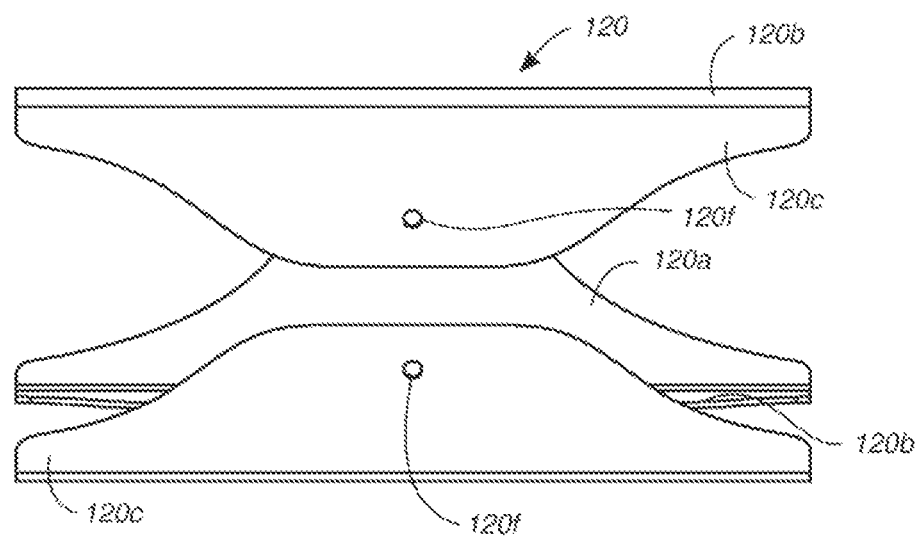

Referring now to FIGS. 2A and 2B, in the illustrated example transverse support 110 is formed from a flat sheet metal blank that is bent along predefined bend lines to form panel section 110a, upper flange 110b, and lower flanges 110c. Upper flange 110b and lower flanges 110c are bent perpendicular to panel 110a to impart stiffness to panel 110a. The sheet metal blank for transverse support 110 is also bent along predefined bend lines to form flanges 110d, which are oriented perpendicular to panel 110a to form side walls to notches 117. Panel 110a includes one or more tabs 140 projecting into each notch 117. Variations including two or more tabs per notch, for example, may have one or more tabs projecting into the notch from either side of the notch. In variations having only one projecting tab per notch, the tabs on the outer notches may preferably be located on the sides of the notches interior to the solar panel rack, away from the edges of the solar panel rack. Tabs 140 may be defined in the sheet metal blank by sheared or cut edges, and remain in the plane of panel 110a, or at least substantially parallel to the plane of panel 110a, when flanges 110d are bent perpendicular to panel 110a. As described below, tabs 140 may be inserted into slots or other openings in brackets 120 to temporarily secure brackets 120 in notches 117 without the use of fasteners. Although two tabs 140 are used for each notch 117 in the illustrated example, any other suitable number of tabs 140 may be used per notch. Alternatively, flanges 110d may comprise one or more preformed slots or other openings into which one or more tabs on brackets 120 may be inserted to temporarily secure brackets 120 in notches 117. In the illustrated example, the dimensions and cross-sectional shape of notches 117 in transverse support 110 are selected to conform to the shape of brackets 120 and to provide a friction fit for brackets 120.

The predefined bend lines in the sheet metal blank for transverse support 110 may comprise any suitable bend-inducing features as described herein, known in the art, or later developed. The sheet metal blank for transverse support 110 may be formed, for example, from galvanized steel sheet having a thickness, for example, of about 1.9 millimeters. Any other suitable material and thickness may also be used.

Referring now to FIGS. 3A-3C, 4A-4C, 5A, and 5B, in the illustrated example bracket 120 is formed from a flat sheet metal blank that is bent along predefined bend lines to form bottom panel 120a, side panels 120b, and upper flanges 120c. Side panels 120b are bent with respect to bottom panel 120a to form a bracket shape conforming to the shape of notch 117 (Figure B) and to the cross-sectional shape of beams 115 (FIG. 6D). Upper flanges 120c may be bent to close (FIG. 3B) and to open (FIG. 3C) the upper end of bracket 120. Side panels 120b comprise slots 120d configured and positioned to engage with corresponding tabs 140 on flanges 110d of transverse support 110 when brackets 120 are properly positioned in notches 117 in transverse support 110.

The predefined bend lines in the sheet metal blank for bracket 120 may comprise any suitable bend-inducing features as described herein, known in the art, or later developed. The sheet metal blank for bracket 120 may be formed, for example, from galvanized steel sheet having a thickness, for example, of about 1.9 millimeters. Any other suitable material and thickness may also be used.

Once bent into shape, brackets 120 are inserted into notches 117 and temporarily secured in place by engaging tabs 140 on transverse support 110 with slots 120d on brackets 120. Beams 115 are positioned in place in brackets 120 (FIG. 4A), and then upper flanges 120c of brackets 120 are bent into their closed positions (FIGS. 4B, 4C) to capture beams 115 within brackets 120. Sheet metal fasteners may then be driven through preformed holes 110e in flanges 110d of transverse support 110 and through correspondingly aligned preformed holes 120e in bracket 120 into beams 115 to secure the brackets 120 and the beams 115 to transverse support 110. Additional sheet metal fasteners may be driven through preformed holes 120f in upper flanges 120c of brackets 120 into beams 115 to further secure beams 115 to brackets 120. The sheet metal fasteners attaching transverse support 110 and brackets 120 to beams 115 may preferably be self-drilling fasteners that drill into and engage beams 115. The use of such self-drilling fasteners allows the position of transverse supports 110 and vertical supports 105 along beams 115 to be selected at the installation site to adapt to local circumstances, such as to rocks or other objects that might interfere with or constrain the positioning of vertical supports 105. Alternatively, the sheet metal fasteners attaching transverse support 110 and brackets 120 to beams 115 may engage preformed holes in beams 115. (Preformed holes referred to here and elsewhere in the specification are formed in corresponding sheet metal blanks prior to bending of the sheet metal blanks to form the desired components).

The ability to temporarily position brackets 120 in transverse support 110 without the use of fasteners, by means of the tab and slot arrangement just described, allows beams 115 to be positioned in the solar panel rack prior to final attachment of the brackets using sheet metal screws. A benefit of this arrangement is that installers need not handle multiple components at one time, nor are fasteners handled at that same time as well. De-coupling complex installation steps may facilitate faster installation as well as lower the labor costs and skill required.

The inventors have recognized that hollow sheet metal beams such as beams 115 may buckle under load if they are supported by hard narrow edges that concentrate the reaction force from the supporting structure onto a narrow region of the hollow beam. Brackets 120 increase the load capacity of beams 115 by distributing the force from the load on beams 115 along the length of the brackets. This helps to prevent buckling that might otherwise occur if the force from the load on beams 115 were concentrated at the hard upper edge of transverse support 110. Further, each bracket 120 is shaped so that its stiffness progressively and gradually decreases with distance in both directions away from transverse support 110 along its beam 115. (The stiffest portion of a bracket 120 is the central region of the bracket that is in contact with and supported by transverse support 110). Because of this progressive decrease in stiffness, the ends of brackets 120 away from transverse support 110 displace significantly downward under load and consequently do not themselves present hard edges that promote buckling of beams 115.

Referring now to FIGS. 5A-5D, in the illustrated example brackets 120 have stiffness that progressively decreases with distance from transverse support 110 because bottom panels 120a, side panels 120b, and upper flanges 120c all have widths that progressively decrease from a wide central portion to narrower portions at the panel's outer edges, farthest from transverse support 110. That is, material has been removed from central regions of the panels away from the transverse support 110, with the regions from which material has been removed having widths that increase with distance from transverse support 110. This configuration enhances load capacity in all four primary load directions—vertically upward, downward, and in both lateral directions. Any other suitable shape or configuration of brackets 120 may also be used to provide the progressive decrease in stiffness just described. For example, the progressive decrease in stiffness of the bracket may alternatively be provided by progressive changes in width of only some of its panels, although such a configuration may not enhance load capacity in directions perpendicular to the panels that do not exhibit progressively reduced stiffness. Further, although the illustrated brackets 120 are symmetric about transverse support 110 and about hollow beams 115, neither of these symmetries is required.

The use of brackets 120 exhibiting progressive decreases in stiffness as described in this specification may advantageously increase the capacity of a solar panel rack to handle high loads caused by wind or snow, for example.

Referring now to FIGS. 6A-6J, in the illustrated example each beam 115 is formed from a flat sheet metal blank 145 (FIGS. 6A-6C, 6I, 6J) that is bent along predefined bend lines to form a beam 115 having a quadrilateral cross-section comprising bottom panel 150a, side panel 150b, top panel 150c, side panel 150d, and closure flanges 150e and 150f (FIGS. 6D-6H). Upon bending of sheet metal blank 145 into the desired cross-sectional shape, flange 150e and bottom panel 150a overlap, and flange 150f and side panel 150d overlap. Flanges 150e and 150f may then be fastened to the panels with which they overlap using sheet metal fasteners passing through preformed holes, for example, or by any other suitable method, to secure beam 115 in its closed configuration.

In the illustrated example, beam 115 is secured in its closed configuration using tabs and slots preformed in sheet metal blank 145. As illustrated, flange 150f comprises a repeating pattern of tabs 155 and flange 150e comprises a corresponding repeating pattern of slots 160 formed along the bend line between flange 150e and side panel 150d. When sheet metal blank 145 is bent to form the desired cross-sectional shape, tabs 155 remain in the plane of bottom panel 150a, or at least substantially parallel to the plane of bottom panel 150a, and thus protrude from flange 150f. These protruding tabs 155 may be inserted through corresponding slots 160 (FIGS. 6E, 6G) and then bent to lie flat alongside panel 150d (FIGS. 6F, 6H) to secure bottom panel 150a to side panel 150d.

Figure 6A:
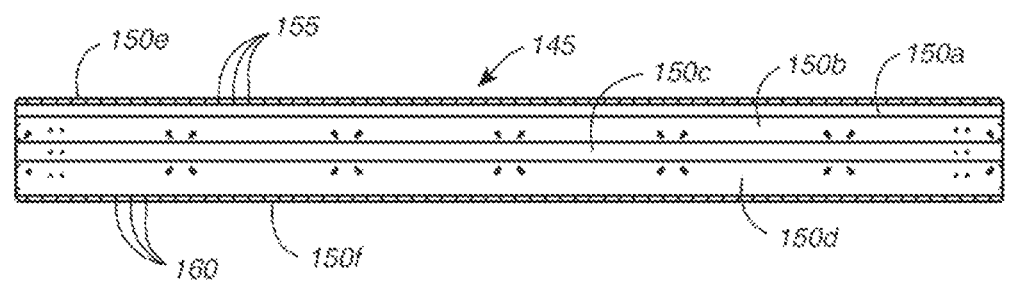
FIG. 6A shows a sheet metal blank that may be folded to form a hollow longitudinal beam for the example solar panel rack.
Figure 6B:
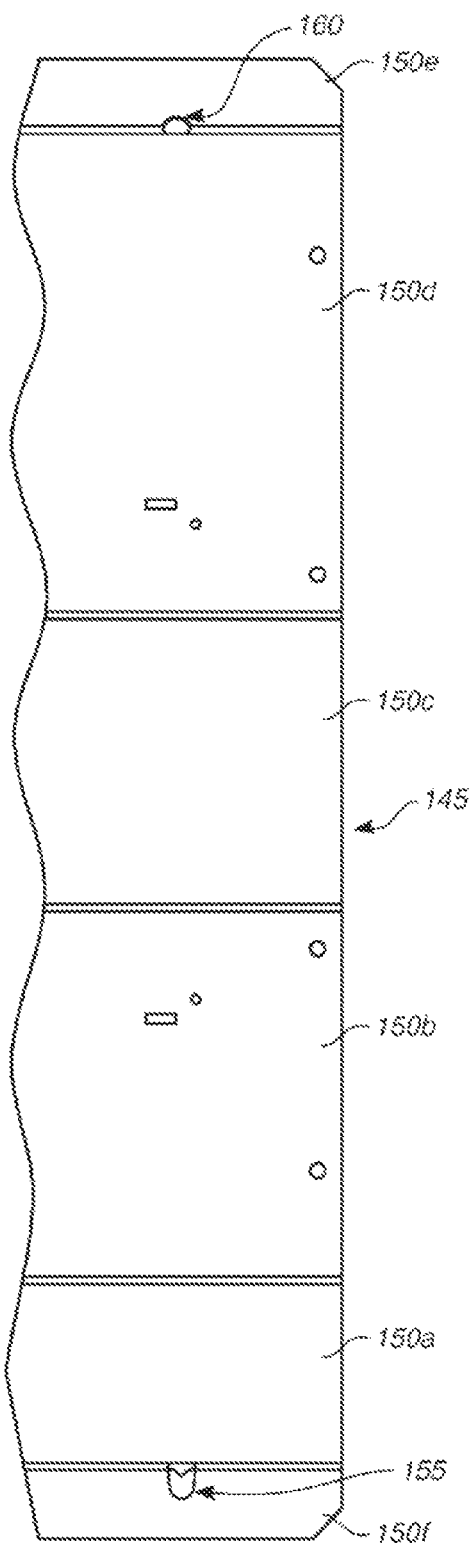
FIG. 6B shows an expanded view of a portion of the blank of 6A.
Figure 6C:
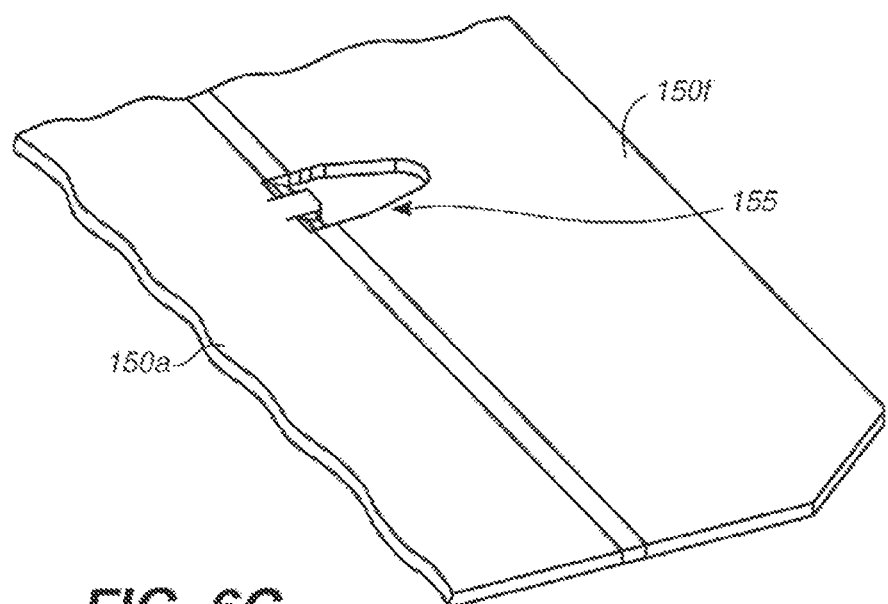
FIGS. 6C-6H show several views of the longitudinal beam at different stages of folding.
Figure 6D:
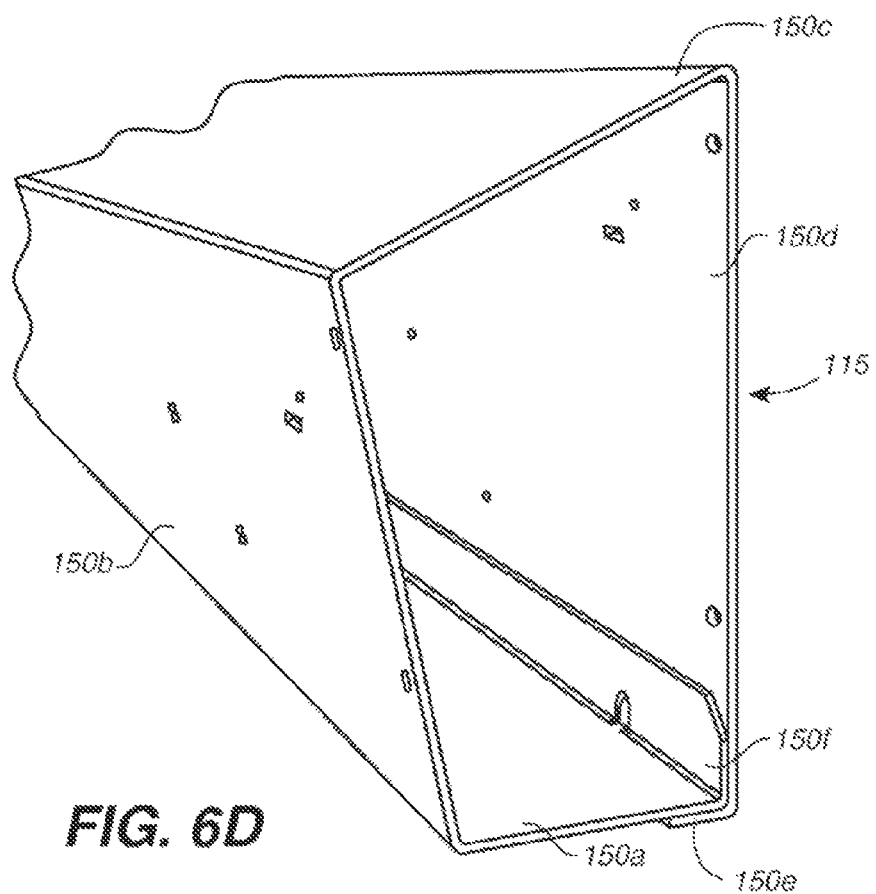
Figure 6E:
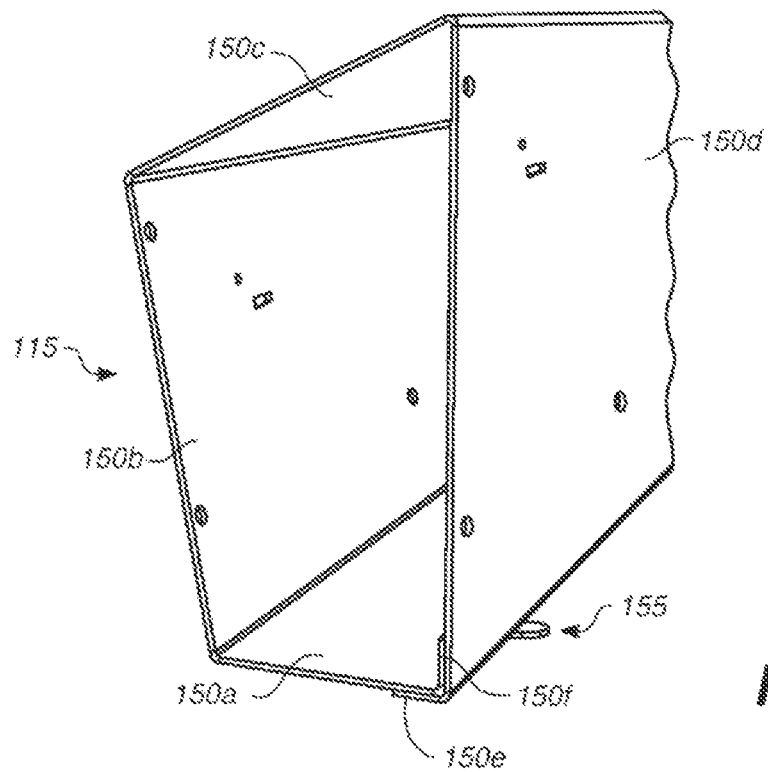
Figure 6F:
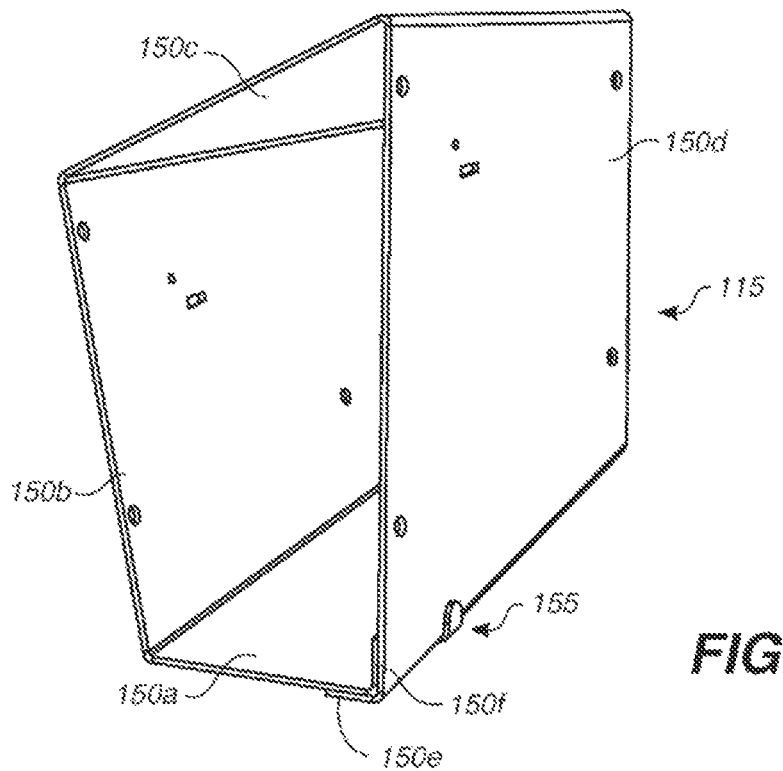
Figure 6G:
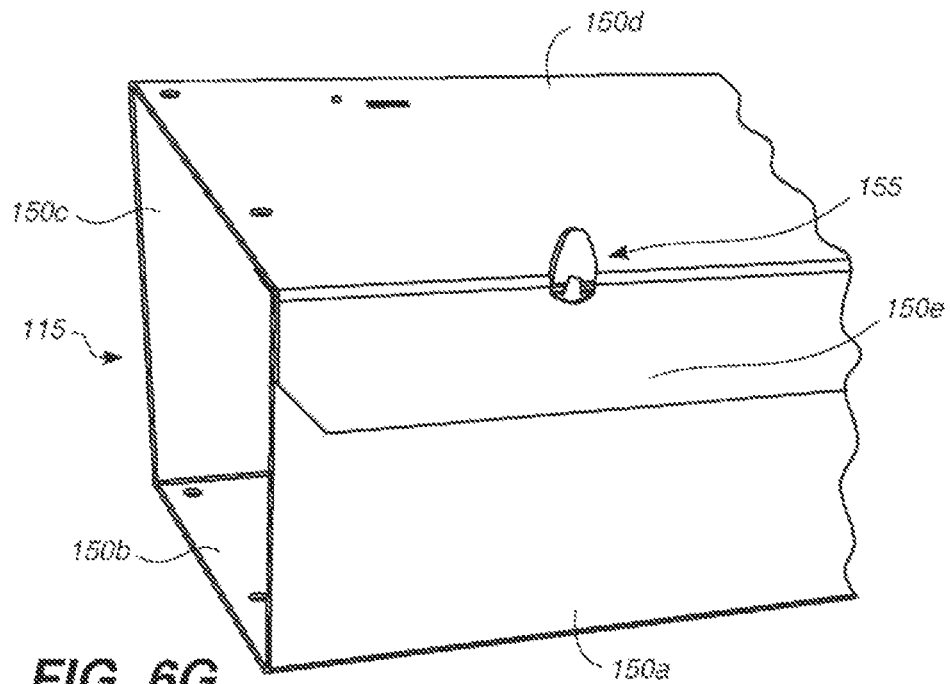
Figure 6H:
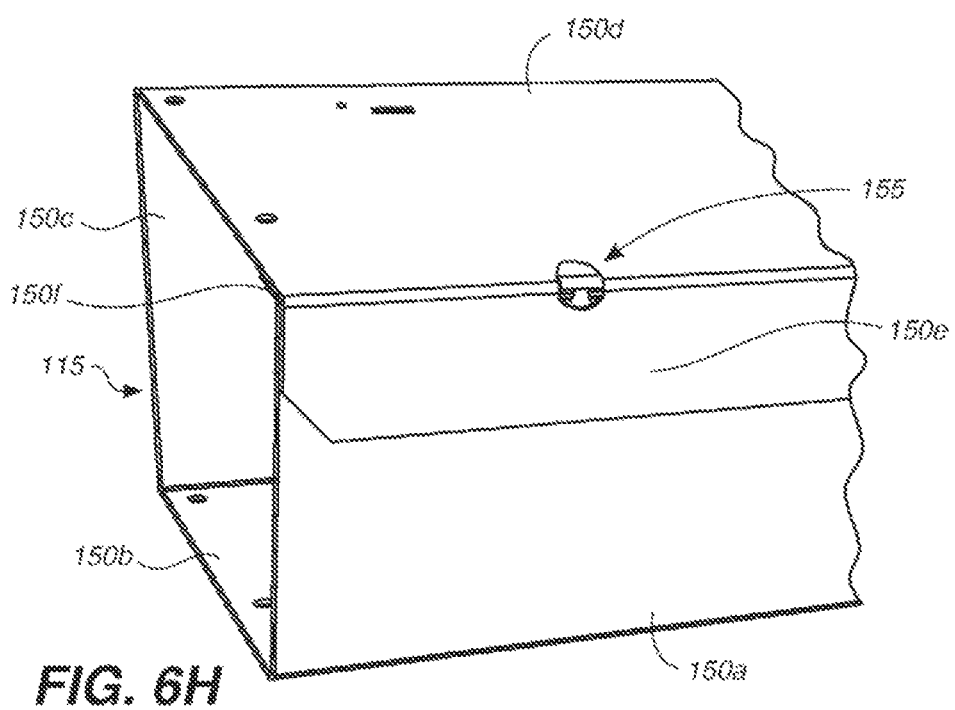
Figure 6I:
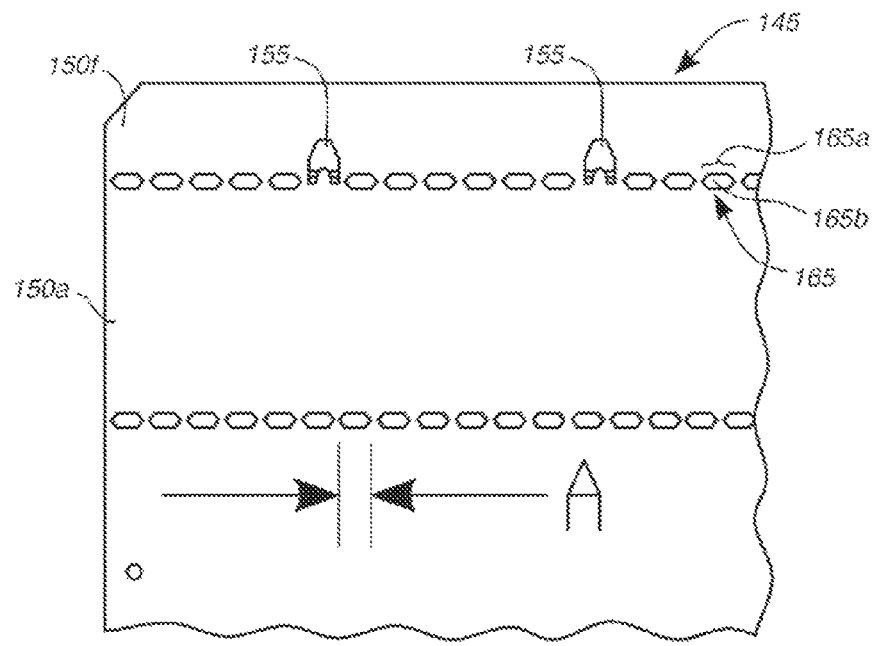
FIG. 6I shows an expanded view of a sheet metal blank as in 6A comprising bend-inducing features formed with a lance.
Figure 6J:
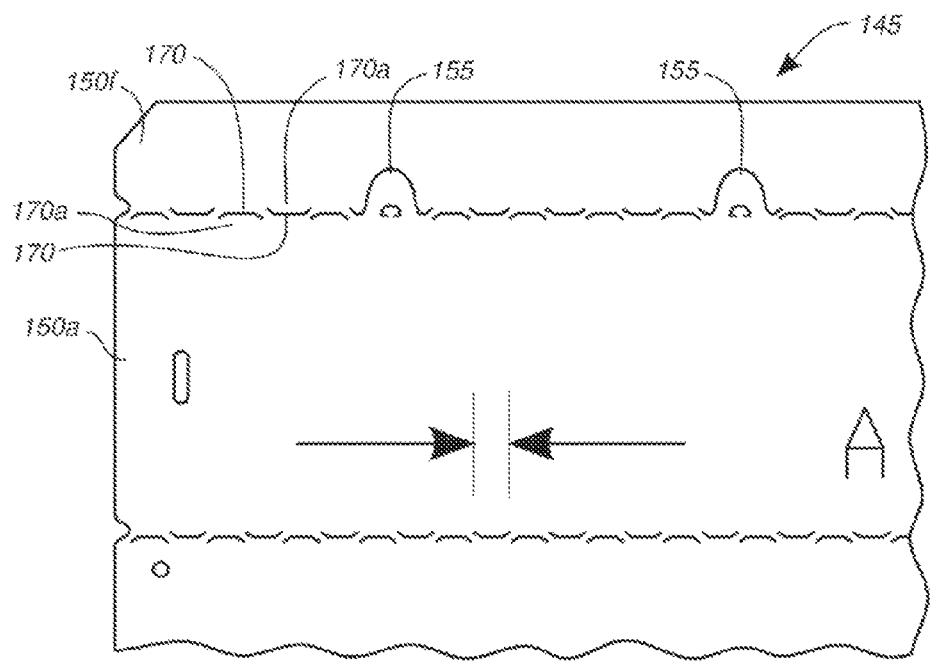
FIG. 6J shows an expanded view of a sheet metal blank as in 6A comprising bend-inducing features formed by laser-cutting.

Preformed tabs 155 may be formed as tongues of material defined by a cut or sheared edge, with the tongues displaced at least partially out of, but still substantially parallel to, the plane of sheet metal blank 145 prior to bending (FIGS. 6B, 6C, 6I). This may be accomplished using sheet metal lancing methods, for example. Alternatively, preformed tabs 155 may be formed as tongues of material defined by a laser-cut edge, with the tongues remaining within the plane of sheet metal blank 145 prior to bending of the blank (FIG. 6J).

The use of integrated tabs 155 and slots 160 as just described allows sheet metal blank 145 to be bent into shape and joined to itself to form a beam 115 without the use of welding, fasteners, or other means of joinery. Such other means of joinery may be used in addition to such tabs and slots if desired, however.

As noted above, beams 115 as illustrated have quadrilateral cross-sectional shapes. Such quadrilateral cross-sectional shapes may allow beams 115 to provide optimal load capacity in all four primary load directions—vertically upward, downward, and in both lateral directions. (Lateral loads may be caused by wind, for example). Other cross-sectional beam shapes may also be used, however, if suitable.

Sheet metal blank 145 may comprise preformed holes or slots into which tabs on panel brackets 125 are to be inserted, as further described below. Alternatively, sheet metal blank 145 may comprise predefined features that, upon folding of the blank, form tabs on beam 115 that may be inserted into preformed holes or slots on panel brackets 125. Such tab and slot arrangements predefine the locations of panel brackets 125, and thus of solar panels 130, with respect to the beams in solar panel rack 100. This promotes installation speed and prevents errors that might otherwise occur in positioning panel brackets 125 and solar panels 130 on solar panel rack 100.

The predefined bend lines in sheet metal blank 145 may comprise any suitable bend-inducing features as described herein, known in the art, or later developed. Sheet metal blank 145 may be formed, for example, from galvanized steel sheet having a thickness, for example, of about 0.9 millimeters or about 1.2 millimeters. Any other suitable material and thickness may also be used.

The inventors have determined that the resistance of beams 115 to buckling under stress may be promoted by particular configurations of bend-inducing features used to define the bend lines in sheet metal blank 145. The inventors have recognized that a beam's resistance to buckling increases as the length of the individual bend-inducing features defining the bend lines is shortened. As further explained below, the inventors have also recognized that there is typically a practical lower limit to the length of a bend-inducing feature, with that lower limit related to the composition and the thickness of the sheet of material. These opposing trends result in optimal ranges for the lengths of bend-inducing features used to define bend lines in sheet metal blanks to be formed into hollow beams such as beams 115.

Referring now to FIG. 6I, bend lines in sheet metal blank 145 may be defined by rows of spaced-apart displacements 165, each of which has a length along the bend line identified as "A" in the drawing. Each displacement 165 comprises a cut or sheared edge 165a of a tongue of material 165b. Severed edge 165a is at least partially curved, and typically has ends that diverge away from the bend line. Tongue 165b is displaced at least partially out of the plane of sheet metal blank 145 at the time displacement 165 is formed, prior to bending of the blank, but remains attached to and substantially parallel to the blank. Lateral ends of the severed edge 165a, and thus of tongue 165b, have a radius of curvature R (not shown).

If the radius of curvature R of the ends of the displacements is too small, the sheet metal blank may crack at the ends of the displacements upon folding of the blank. The inventors have determined that the radius of curvature R of the ends of the displacement 165 in sheet metal blank 145 should be selected to be $R_{min}$, or larger than but approximately $R_{min}$, where $R_{min}$ is the minimum radius of curvature that may be used without initiating cracking at the ends of the displacements upon folding the sheet metal blank to form the beam. The practical lower limit to the length of a displacement 165 is approximately $2R_{min}$. Typically, larger sheet thicknesses require a larger radius of curvature R to prevent cracking. More brittle materials also require a larger radius of curvature. The inventors have also found that resistance to beam buckling decreases with increasing displacement length "A", and that resistance to beam buckling has typically decreased significantly for displacements having a length "A" greater than approximately $6R_{min}$. Thus inventors have determined that bend inducing displacements to be used in forming a hollow sheet metal beam 115 preferably have a length "A" that satisfies the relationship $A \leq \sim 6R_{min}$, or more preferably satisfies the relationship $\sim 2R_{min} \leq A \leq \sim 6R_{min}$.

Referring now to FIG. 6J, bend lines in sheet metal blank 145 may alternatively be defined by rows of spaced-apart "smile shaped" slits 170, with adjacent slits on alternating sides of the bend line. Slits 170, which penetrate through sheet metal blank 145, define tongues 170a that remain in the plane of sheet metal blank 145 prior to bending. As illustrated, lateral ends of the slits 170 diverge away from the bend line. Each of slits 170 has a length along the bend line identified as "A" in the drawing. The inventors have determined that such bend-inducing smile-shaped slits to be used in forming a hollow sheet metal beam 115 preferably have a length "A" that falls within the same range as that for the use of displacements as discussed above. That is, the length A of the smile shaped slits should satisfies the relationship $A \leq \sim 6R_{min}$, or more preferably satisfies the relationship $\sim 2R_{min} \leq A \leq \sim 6R_{min}$, where $R_{min}$ is the minimum radius of curvature that may be used for displacements (as discussed above) without initiating cracking at the ends of the displacements upon folding the sheet metal blank to form the beam.

Beams 115 may be formed, for example, from galvanized steel sheets having a thickness of about 0.9 millimeters or about 1.2 millimeters and bend lines defined by displacements or smile-shaped slits, as described above, having lengths of about 9 millimeters or less.

As noted above, two beams 115 may be arranged collinearly in a solar panel rack 100 and spliced together using internal splices 135. Referring now to FIGS. 7A-7G, in the illustrated example a splice 135 may be formed from a sheet metal blank that is bent along predefined bend lines to form a short hollow beam section having a quadrilateral cross-section comprising bottom panel 175a, side panel 175b, top panel 175c, side panel 175d, and closure flange 175e. Panels 175a, 175b, 175c, and 175d correspond in position, shape, and orientation to panels in beam 115. Closure flange 175e may be bent into contact with and optionally fastened to side wall 175b. Outer cross-sectional dimensions of splice 135 approximately match the internal cross-sectional dimensions of beams 115, to allow a tight fit between the splice and a beam as further described below. Splices 135 may have a length, for example, of about 0.25 meters to about 1.0 meters.

Figure 7A:
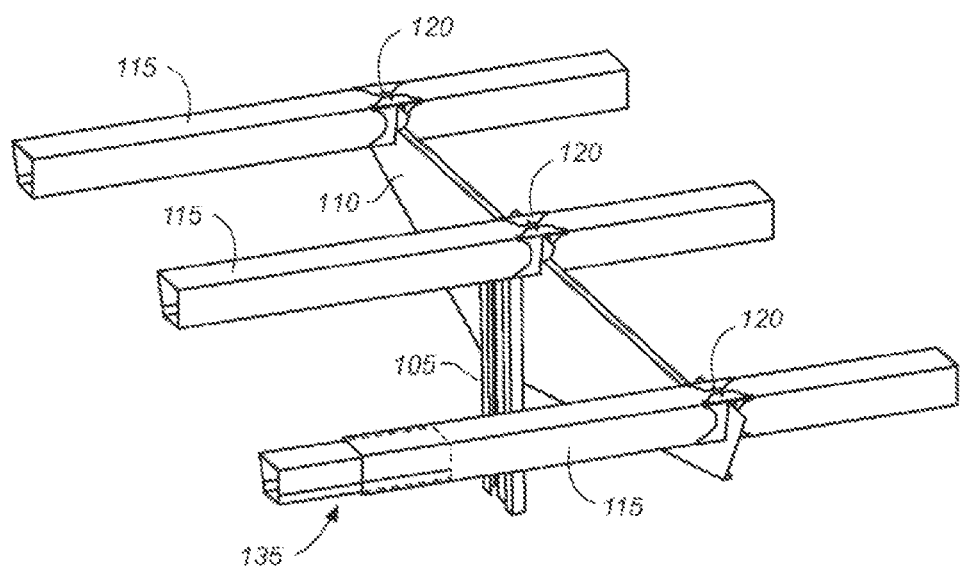
FIGS. 7A-7G show several views of a collapsible and expandable internal splice and its use in coupling two hollow beam sections together to form a longer hollow beam.
Figure 7B:
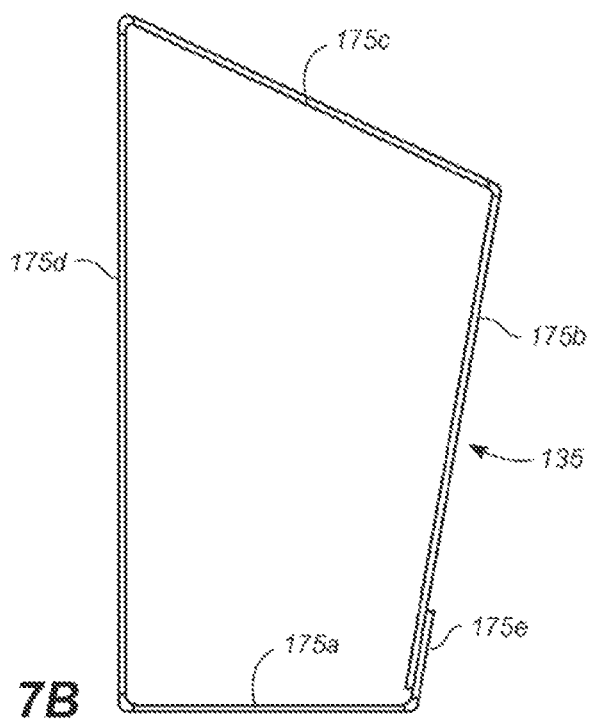
Figure 7C:
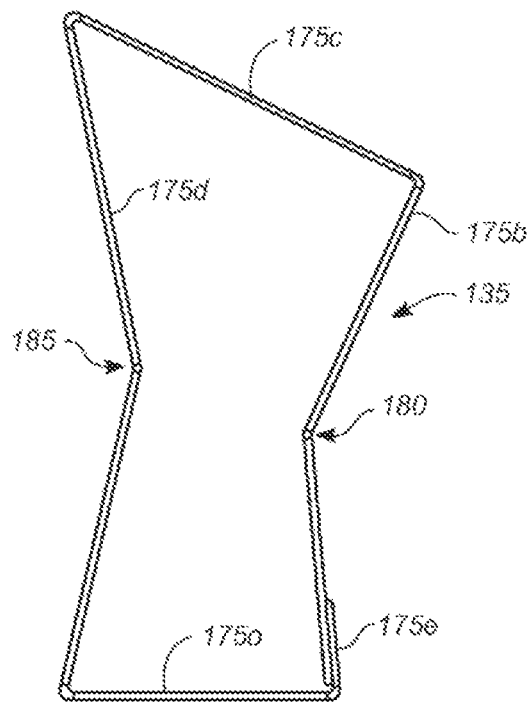
Figure 7D:
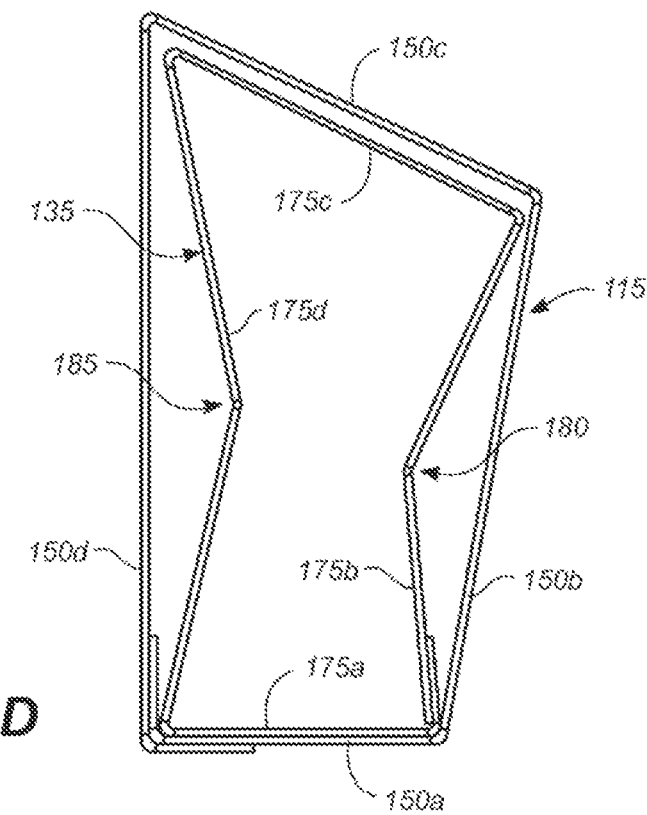
Figure 7E:
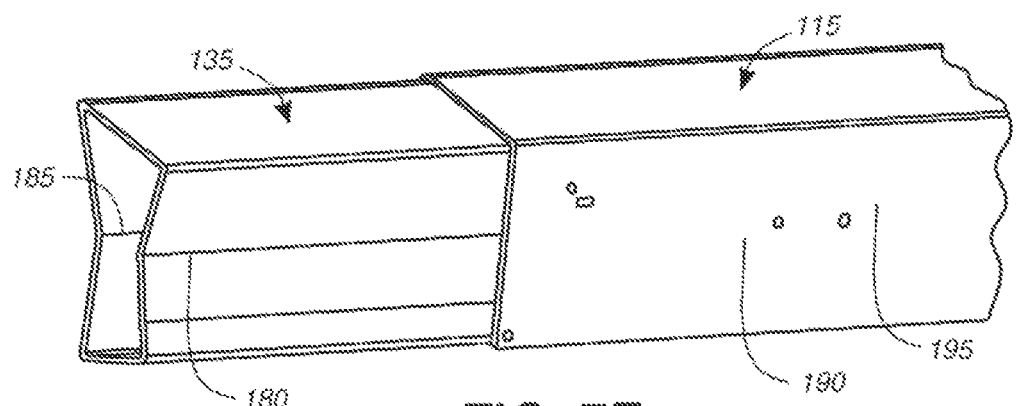

Splice 135, and the sheet metal blank from which it is formed, also comprise two or more additional predefined bend lines which may be bent with low force to partially collapse splice 135. In the illustrated example, splice 135 comprises predefined low-force bend lines 180 and 185 running parallel to the long axis of the splice in side panels 175b and 175d, respectively, which are positioned on opposite sides of splice 135. These low force bend lines allow splice 135 to be partially collapsed (FIG. 7C), and then inserted into an end of a hollow beam 115 (FIGS. 7D and 7E). Typically, splice 135 is inserted into beam 115 to a depth of about one half the length of splice 135, as shown in FIG. 7A, for example. A second hollow beam 115 may then be slid over the remaining exposed half length of splice 135.

Figure 7F:
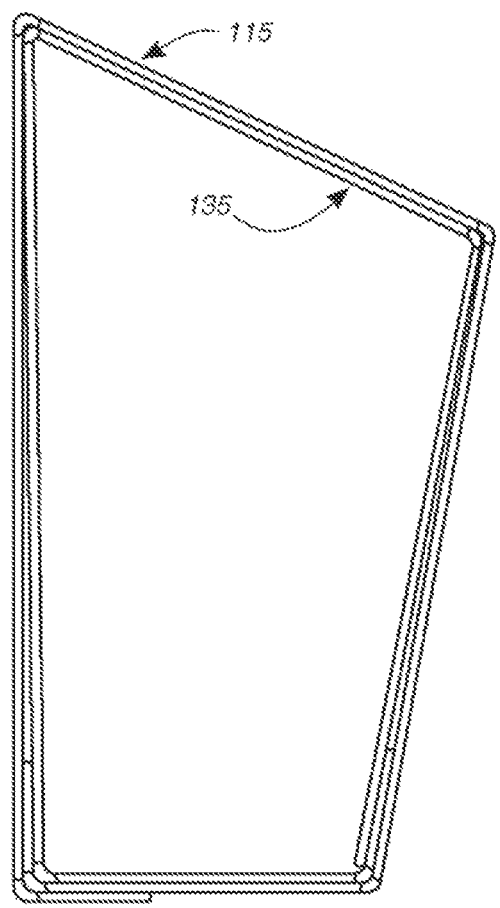
Figure 7G:
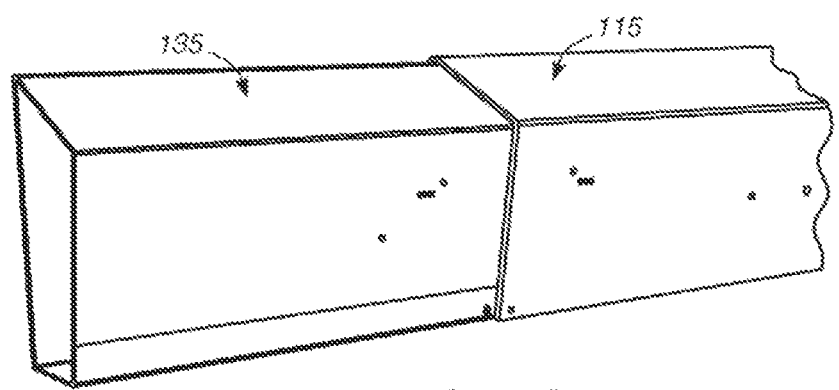

Splice 135, in its collapsed configuration, may thus be positioned entirely within two adjacent and collinear hollow beams 115. Sheet metal fasteners may then be inserted through preformed clearance holes 190 (FIG. 7E) in each of the two hollow beams 115 to engage preformed holes in side panels 175b and 175d of splice 135 to pull splice 135 into its expanded configuration (FIGS. 7F, 7G). The two hollow beams 115 are thereby coupled to each other through their attachment to splice 135. (Note that in order to show a perspective view of an expanded splice 135 in position inside a hollow beam 115, FIG. 7G shows only one of the two hollow beams 115 typically coupled to such a splice).

Further, because the outer cross-sectional dimensions of splice 135 approximately match the internal cross-sectional dimensions of beams 115, when splice 135 is expanded within beams 115 the splice's top, bottom, and side panels fit tightly against the corresponding panels of the beams 115. This provides strength and stiffness that allows splice 135 and its attached beams 115 to handle multidirectional loads. In addition, splice 135 does not interfere with the positions of other components of solar rack 100 that are attached to beams 115, such as panel brackets 125 for example, because splice 135 in its final configuration is located within beams 115.

Hollow beams 115 may optionally comprise preformed holes 195 (FIG. 7E) through which a screwdriver or other object may be temporarily inserted as a stop to control the depth to which a splice 135 is inserted into a hollow beam 115.

The predefined bend lines in the sheet metal blank for splice 135 may comprise any suitable bend-inducing features as described herein, known in the art, or later developed. The sheet metal blank for splice 135 may be formed, for example, from galvanized steel sheet having a thickness, for example, of about 0.9 millimeters to about 1.2 millimeters. Any other suitable material and thickness may also be used.

Figure 8A:
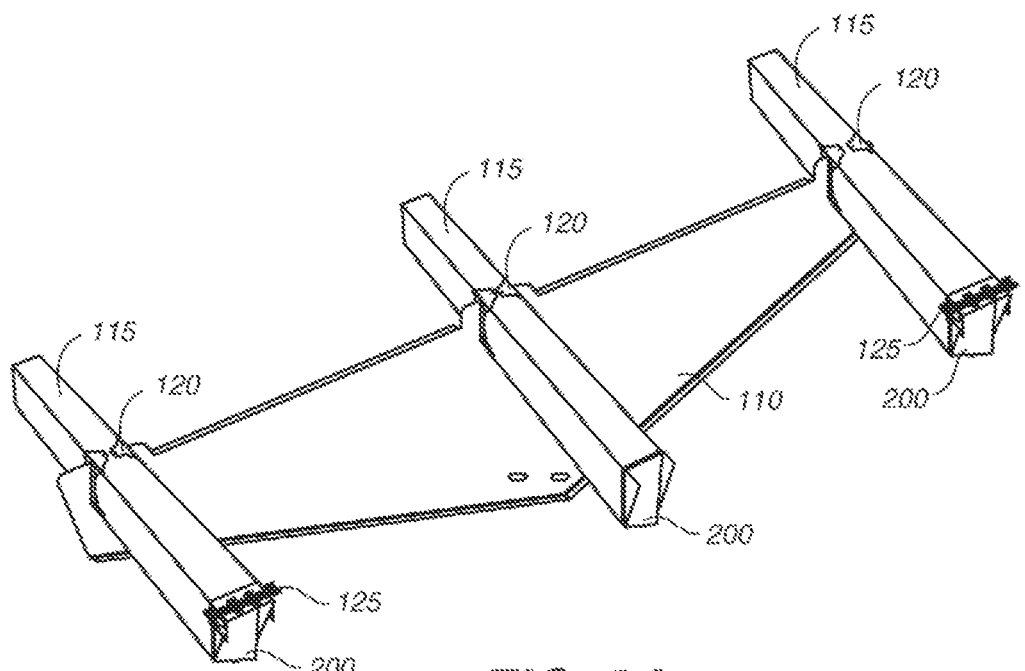
FIGS. 8A and 8B show a longitudinal beam end cap (FIG. 8B) and three such end caps at the ends of longitudinal beams in a portion of a solar panel rack (FIG. 8A).
Figure 8B:
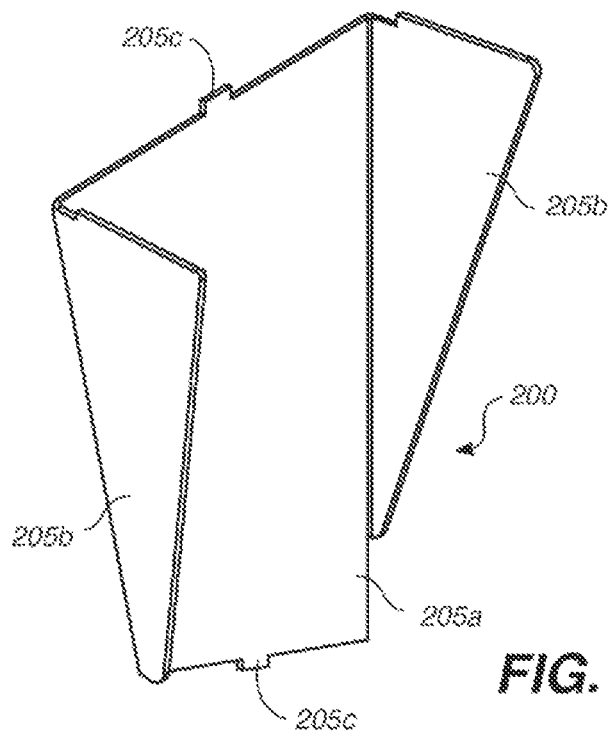

Referring now to FIGS. 8A and 8B, solar panel rack 100 may also comprise end caps 200 inserted into and closing the ends of hollow beams 115 at the ends of solar panel rack 100. An end cap 200 may be formed from a sheet metal blank bent along predefined bend lines to form end panel 205a and side flanges 205b. End panel 205a may be inserted into the end of a hollow beam 115, with tabs 205c on end panel 205a engaging corresponding preformed slots in the hollow beam 115 to retain the end cap in the hollow beam. Alternatively, hollow beam 115 may comprise tabs that are inserted into preformed slots in side flanges 205b to retain the end cap in the hollow beam. In either case, side flanges 205b may extend outward from and collinearly with hollow beam 115 to support an overhanging portion of a panel bracket 125 positioned at the end of hollow beam 115 (FIG. 8A).

The predefined bend lines in the sheet metal blank for end cap 200 may comprise any suitable bend-inducing features as described herein, known in the art, or later developed. The sheet metal blank for end cap 200 may be formed, for example, from galvanized steel sheet having a thickness, for example, of about 0.5 millimeters to about 1.2 millimeters. Any other suitable material and thickness may also be used.

Referring now to FIGS. 9A-9G, in the illustrated example a panel bracket 125 is formed from a sheet metal blank that is bent along predefined bend lines to form a top panel 210a, side panels 210b bent downward from top panel 210a to conform to the cross-sectional shape of a hollow beam 115, four positioning tabs 210c located in a square or rectangular arrangement in a central portion of top panel 210a and extending upward from panel 210a, four solar panel clinching tabs 210d extending upward from panel 210a and each positioned adjacent to a positioning tab 210c, and flanges 210e bent perpendicularly outward from side panels 210b to stiffen side panels 210b.

Figure 9A:
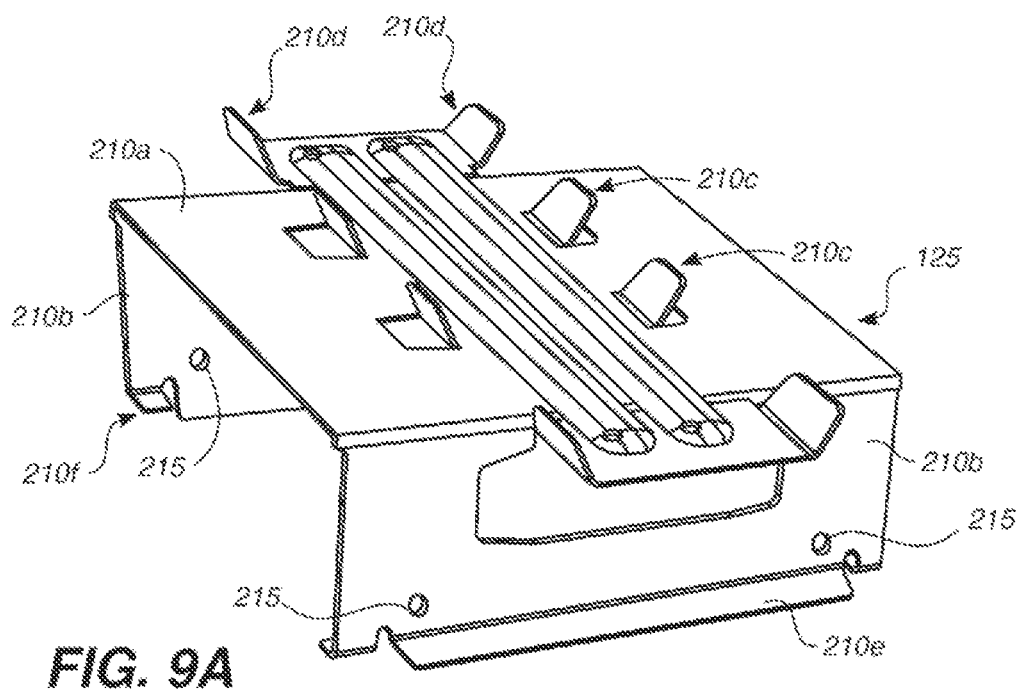
FIGS. 9A and 9B show perspective and side views, respectively, of a panel bracket configured to attach the corners of four neighboring solar panels to a longitudinal beam in the example solar panel rack.
Figure 9B:
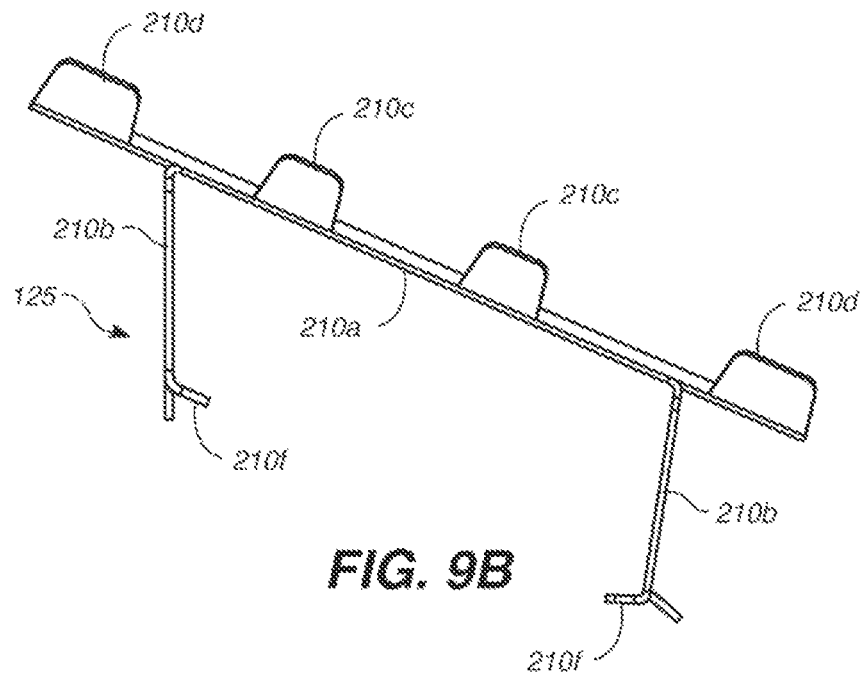
Figure 9C:
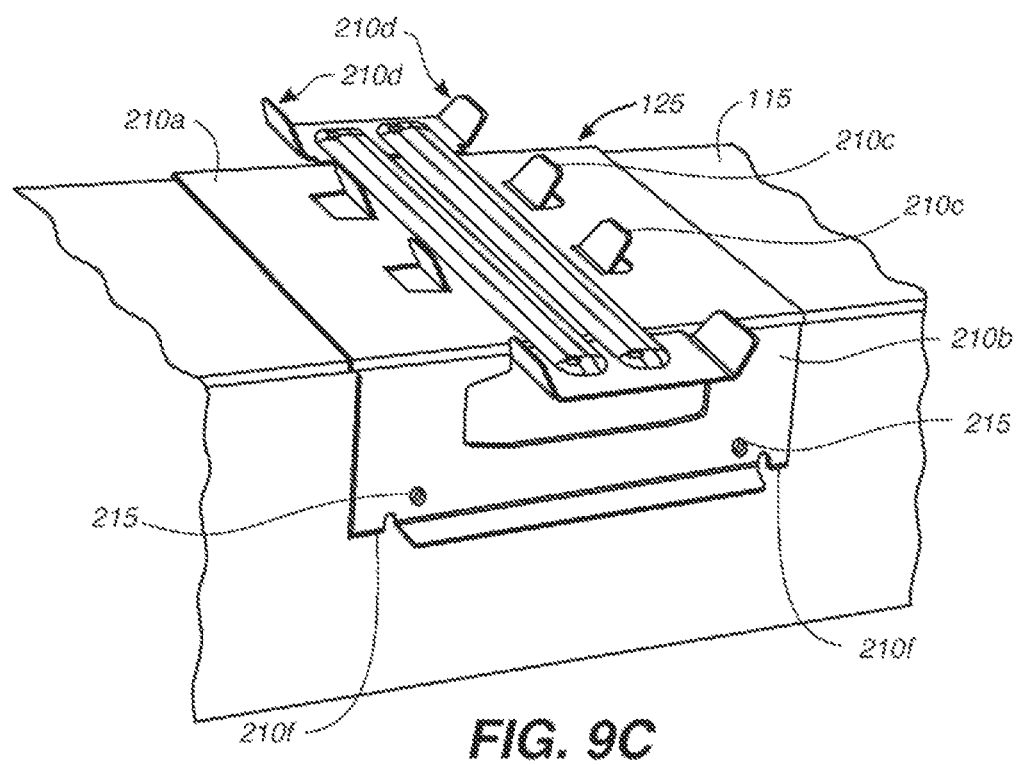
FIG. 9C shows a panel bracket attached to a longitudinal beam.
Figure 9D:
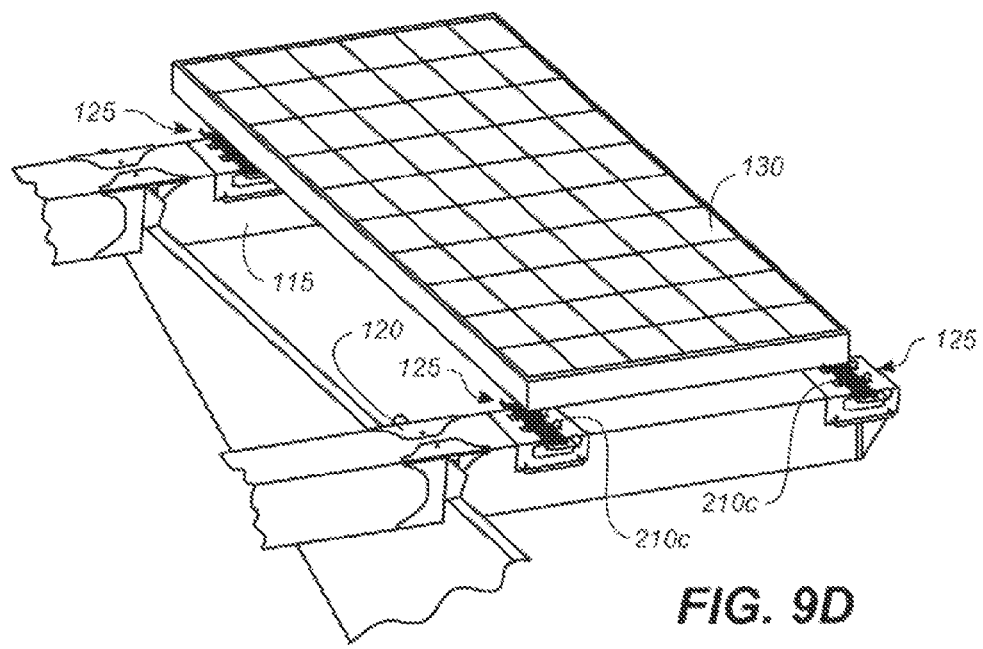
FIGS. 9D-9G show successive stages of attaching four neighboring solar panels to the example solar panel rack using the panel brackets.
Figure 9E:
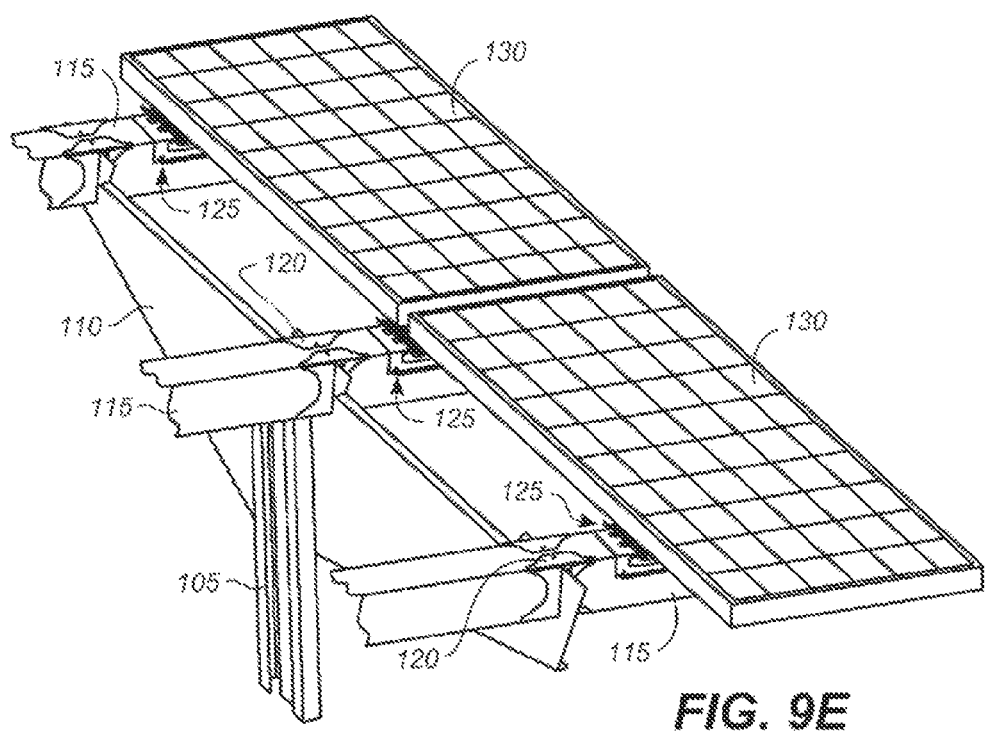
Figure 9F:
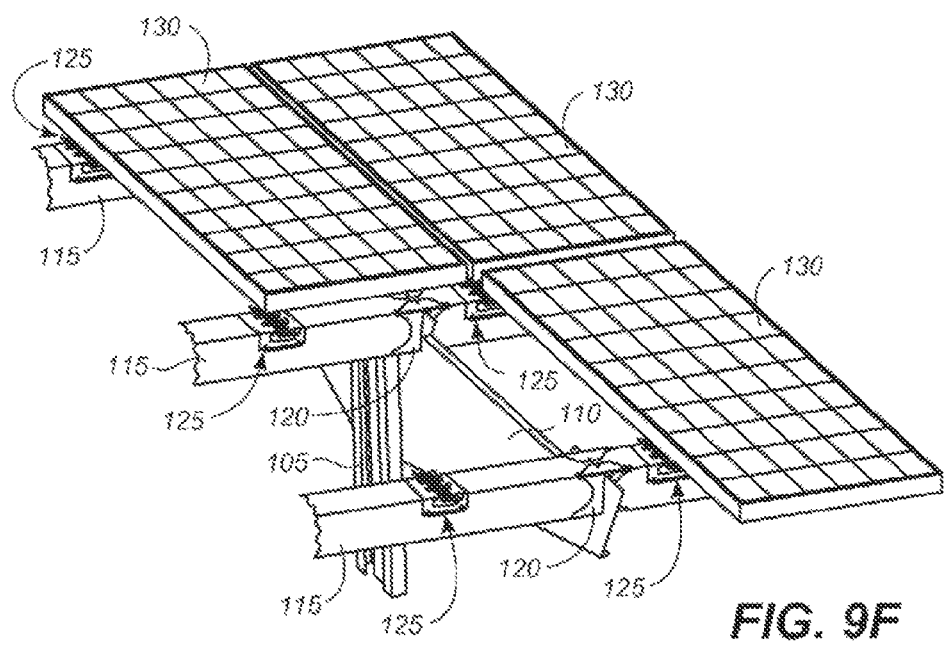
Figure 9G:
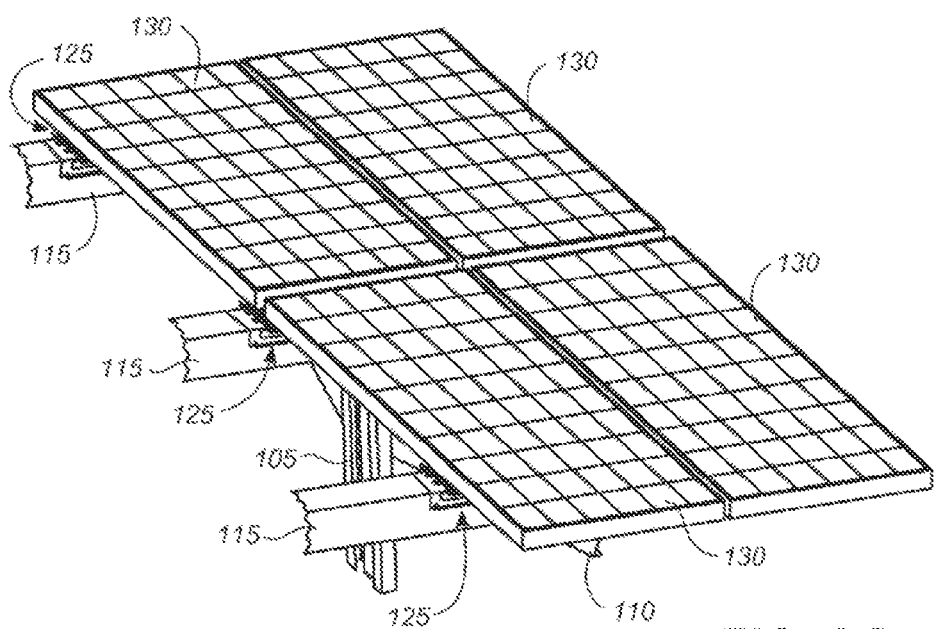

Side panels 210b of panel brackets 125 comprise tabs 210f that may be inserted into preformed slots in a hollow beam 115 to position the panel brackets at desired locations on the hollow beam (FIGS. 9B, 9C). As further described below, panel brackets 125 are configured to properly position and attach the corners of up to four solar panels 130 to a hollow beam 115. This arrangement allows the preformed slots in hollow beams 115 to predefine the positions of solar panels 130 on solar panel rack 100.

To position and attach solar panels 130 to solar panel rack 100, panel brackets 125 are first positioned on hollow beams 115 using the tab and slot arrangement described above. Panel brackets 125 may then be further secured to the beams with sheet metal fasteners driven through preformed holes 215 in side panels 210b into preformed holes in hollow beams 115. Solar panels 130 are then guided into position by contact between outer edges of solar panels 130 and positioning tabs 210c, as well as by contact between solar panels 130 and clinching tabs 210d (FIGS. 9D-9G).

Figure 10A:
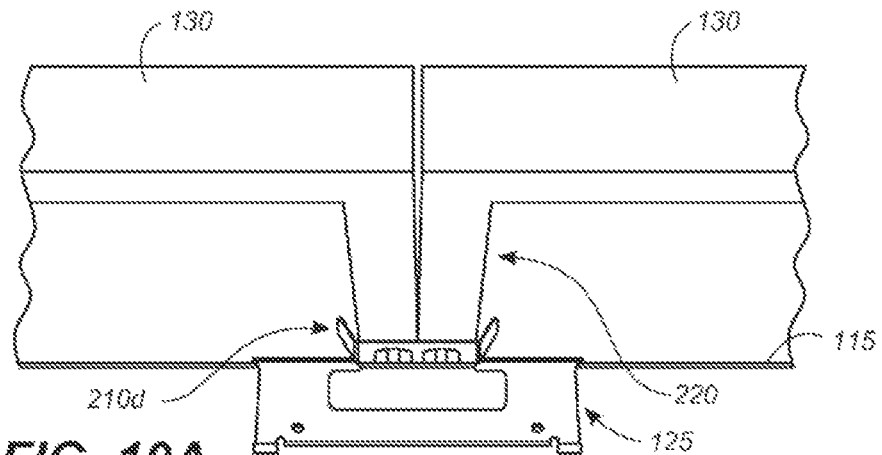
FIGS. 10A-10C illustrate a clinching process by which two neighboring solar panels may be simultaneously secured to the example solar panel rack by the panel bracket of FIGS. 9A-9G.
Figure 10B:
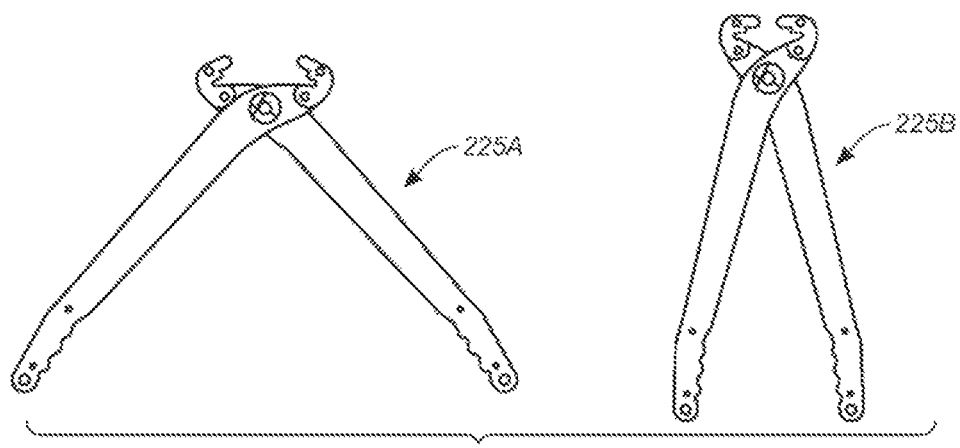
Figure 10C:
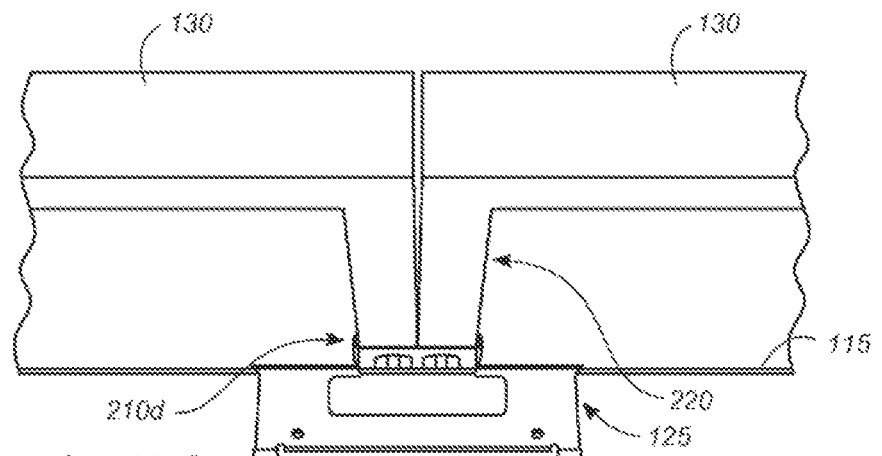

Clinching tabs 210d are configured to be clinched around industry-standard features 220 on solar panels 130 to attach the solar panels to panel brackets 125 and thus to hollow beams 115 (FIGS. 10A, 10C). In the illustrated example, a pair of clinching tabs 210d located on the same side of a hollow beam 115 may be simultaneously clinched around features 220 on adjacent solar panels 130 using a conventional clinching tool shown in FIG. 10B in its open 225A and clinched 225B configurations. This simultaneous clinching method increases the speed of installation. Optionally, solar panels 130 may be further secured to panel brackets 125 with fasteners passing through preformed holes in panel bracket 125. Features 220 may be flanges on an outer frame of solar panel 130, for example.

In addition to positioning solar panels 130 and attaching them to beams 115, panel brackets 125 also better distribute the load from solar panels 130 along beams 115 than would be the case if the solar panels were attached directly to beams 115. The ability of a single panel bracket 125 to position and attach corners of up to four solar panels to solar panel rack 100 may reduce part counts and labor, and thus cost.

Although panel brackets 125 are shown has having particular numbers of positioning and clinching tabs, any suitable number of such tabs may be used.

The predefined bend lines in the sheet metal blank for panel bracket 125 may comprise any suitable bend-inducing features as described herein, known in the art, or later developed. The sheet metal blank for panel bracket 125 may be formed, for example, from galvanized steel sheet having a thickness, for example, of about 1.5 millimeters. Any other suitable material and thickness may also be used. Bend lines between top panel 210a and side panels 210b may preferably be predefined, for example, by bend-inducing features disclosed in U.S. Patent Application Publication No. 2010/0122563.

Although the illustrated examples of solar panel rack 100 are described above as configured for ground mounting, solar panel rack 100 may alternatively be mounted on roof-tops. Variations of solar panel rack 100 to be roof-top mounted may use vertical supports 105 as described above, or substitute any suitable vertical support. Any suitable method of attaching solar panel rack 100 to a roof-top may be used.

As illustrated, transverse support 110 in solar panel rack 100 is statically mounted to vertical supports 105 so that solar panel rack 100 maintains a fixed orientation. In other variations, transverse support 110 may be pivotably mounted to vertical supports 105, by any suitable pivot mechanism, to rotate around an axis extending parallel to the long axes of hollow beams 115. This arrangement allows transverse support 110 and beams 115 to be rotated so that solar panels 130 track motion of the sun across the sky during, for example, the course of a day or the course of a year. Any suitable rotation drive may be used to rotate the upper portion of such a solar panel rack 100 in this manner.

Although solar panel rack 100 is described above as supporting photovoltaic solar panels, in other variations the solar panel racks described herein may be used to support solar water heating panels rather than, or in addition to, photovoltaic solar panels. Any suitable modification may be made to the solar panel racks described herein to accommodate mounting such solar water heating panels.

Further, although the rack structures disclosed herein have been described as supporting solar panels, they may instead be used to support reflectors such as mirrors, for example, used to direct solar radiation to a solar energy receiver, for example. Such rack structures supporting reflectors may be statically mounted, or pivotably mounted as described above so that the reflectors may be rotated about an axis to track motion of the sun.

The hollow beams, beam brackets, and hollow beam splices described above are not restricted to use in solar panel racks but may instead be used individually or in any combination with each other in any structure for which they are suitable. Further, the cross-sectional shapes of hollow beams, beam brackets, and splices as disclosed herein are not restricted to the particular quadrilateral cross-sectional shapes shown in the drawings, but instead may take any shape suitable for the purpose for which the beams, beam brackets, or splices are employed. The hollow beam splices described herein are not restricted to use in coupling hollow beams formed from folded sheet metal, but may instead be used to couple hollow beams, tubes, or pipes formed by any method including cast, extruded, or machined hollow beams. Generally, the cross-sectional shape of the splice in its expanded form should conform to and tightly fit an inner cross-sectional shape of the hollow beams, pipes, or tubes to be coupled. Similarly, the cross-sectional shape of a beam bracket should conform to and tightly fit an outer cross-sectional shape of the hollow beam that it is supporting.

This disclosure is illustrative and not limiting. Further modifications will be apparent to one skilled in the art in light of this disclosure and are intended to fall within the scope of the appended claims.

What is claimed is:

1. A solar panel rack comprising:
    at least first and second hollow sheet metal beams arranged side by side and in parallel with each other to define a plane, each hollow sheet metal beam having a closed configuration of side walls along its longitudinal axis defining a hollow cross-section perpendicular to its longitudinal axis;
    a transverse support comprising two or more notches located in its upper edge;
    two or more first sheet metal brackets, each first sheet metal bracket having an outer cross-sectional shape substantially conforming to an inner cross-sectional shape of a corresponding notch in the transverse support, having an inner cross-sectional shape substantially conforming to the outer-cross sectional shape of a corresponding hollow sheet metal beam, positioned in the corresponding notch in the transverse support, and attached to and supporting the corresponding hollow sheet metal beam at least partially within the corresponding notch in the transverse support, each first sheet metal bracket formed from a single sheet of metal and comprising upper flanges configured to be closed around the corresponding hollow sheet metal beam to capture the hollow sheet metal beam within the first sheet metal bracket;
    one or more second sheet metal brackets, each second sheet metal bracket having an inner cross-sectional shape substantially conforming to the outer cross-sectional shape of a corresponding hollow sheet metal beam, positioned on and attached to the corresponding hollow sheet metal beam, and configured to couple to a solar panel or solar panel assembly to position and attach the solar panel or solar panel assembly to the solar panel rack in a desired location in the plane defined by the hollow sheet metal beams;
    a third hollow sheet metal beam arranged collinearly with the first or the second hollow sheet metal beam and having a closed configuration of side walls along its longitudinal axis defining a hollow cross-section perpendicular to its longitudinal axis; and
    an expandable and collapsible hollow sheet metal beam having a closed configuration of side walls along its longitudinal axis defining a hollow cross-section perpendicular to its longitudinal axis, the expandable and collapsible hollow sheet metal beam configured to be bent along predefined bend lines to assume a collapsed configuration, inserted while in the collapsed configuration into adjoining ends of the collinear hollow sheet metal beams, expanded to a configuration having an outer cross-sectional shape conforming to and tightly fitting an internal cross-sectional shape of the collinear hollow sheet metal beams, then attached to both of the collinear hollow sheet metal beams to couple the collinear hollow sheet metal beams to each other.

2. The solar panel rack of claim 1, wherein:
    each hollow sheet metal beam is formed by bending a sheet metal blank along bend lines predefined in the sheet metal blank by bend-inducing features; and
    the bend-inducing features each have a length A and each have a radius of curvature R at each end, where R is approximately a minimum radius of curvature required to prevent cracking at ends of the bend-inducing features upon bending of the blank along the bend lines, and A is less than or equal to about 6R.

3. The solar panel rack of claim 2, wherein A is greater than or equal to about 2R.

4. The solar panel rack of claim 1, wherein each hollow sheet metal beam is formed by bending a single sheet metal blank comprising preformed tabs and slots configured to secure the sheet metal blank in a beam configuration upon bending of the blank into the beam configuration.

5. The solar panel rack of claim 1, wherein each hollow sheet metal beam is formed from a single sheet of metal and comprises preformed slots or other openings configured to predefine the locations at which solar panels or solar panel assemblies are to be attached to the solar panel rack.

6. The solar panel rack of claim 1, wherein the transverse support is formed from a single sheet of metal and comprises flanges forming side walls for the notches, and the side walls of each notch are attached to opposite sides of a first sheet metal bracket positioned in the notch.

7. The solar panel rack of claim 6, wherein the transverse support comprises one or more preformed tabs or slots configured to engage one or more corresponding slots or tabs in the first sheet metal bracket to at least partially secure the first sheet metal bracket in position on the transverse support.

8. The solar panel rack of claim 1, wherein each first sheet metal bracket comprises one or more tabs or slots configured to engage one or more corresponding slots or tabs in the transverse support to at least partially secure the first sheet metal bracket in position on the transverse support.

9. The solar panel rack of claim 1, wherein each first sheet metal bracket extends beyond the transverse support in both directions along its corresponding hollow sheet metal beam.

10. The solar panel rack of claim 1, wherein each second sheet metal bracket is formed from a single sheet of metal and comprises one or more upwardly pointing tabs configured to contact features on a solar panel or solar panel assembly to position the solar panel or solar panel assembly in a desired location.

11. The solar panel rack of claim 10, wherein the one or more upwardly pointing tabs on each second sheet metal bracket configured to contact features on a solar panel or solar panel assembly to position the solar panel or solar panel assembly in a desired location are located in a square or rectangular arrangement in a central portion of a top panel of the second sheet metal bracket and extend upward from the top panel.

12. The solar panel rack of claim 1, wherein each second sheet metal bracket is configured to position and attach adjacent corners of four solar panels or solar panel assemblies to the solar panel rack.

13. The solar panel rack of claim 1, wherein each second sheet metal bracket is formed from a single sheet of metal and comprises one or more upwardly pointing clinching tabs configured to be clinched to features on a solar panel or solar panel assembly to attach the solar panel or solar panel assembly to the solar panel rack.

14. The solar panel rack of claim 13, wherein a pair of two clinching tabs are configured to be simultaneously clinched to attach two solar panels or solar panel assemblies to the solar panel rack.

15. The solar panel rack of claim 1, wherein:
each hollow sheet metal beam is formed by bending a sheet metal blank comprising preformed tabs and slots configured to secure the sheet metal blank in a beam configuration upon bending of the blank into the beam configuration and comprising preformed slots or other openings configured to predefine the locations at which solar panels or solar panel assemblies are to be attached to the solar panel rack;
each first sheet metal bracket extends beyond the transverse support in both directions along its corresponding hollow sheet metal beam; and
each second sheet metal bracket is formed from a single sheet of metal and comprises one or more upwardly pointing tabs configured to contact features on a solar panel or solar panel assembly to position the solar panel or solar panel assembly in a desired location and one or more upwardly pointing tabs configured to be clinched to features on a solar panel or solar panel assembly to attach the solar panel or solar panel assembly to the solar panel rack.

16. The solar panel rack of claim 15, wherein the one or more upwardly pointing tabs on each second sheet metal bracket configured to contact features on a solar panel or solar panel assembly to position the solar panel or solar panel assembly in a desired location are located in a square or rectangular arrangement in a central portion of a top panel of the second sheet metal bracket and extend upward from the top panel.

17. The solar panel rack of claim 15, wherein each second sheet metal bracket is configured to position and attach adjacent corners of four solar panels or solar panel assemblies to the solar panel rack.

* * * * *